(12) United States Patent
Hashimoto

(10) Patent No.: US 10,476,235 B2
(45) Date of Patent: Nov. 12, 2019

(54) QUANTUM CASCADE LASER

(71) Applicant: SUMITOMO ELECTRIC INDUSTRIES, LTD., Osaka (JP)

(72) Inventor: Jun-ichi Hashimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/011,928

(22) Filed: Jun. 19, 2018

(65) Prior Publication Data

US 2018/0375292 A1    Dec. 27, 2018

(30) Foreign Application Priority Data

Jun. 22, 2017   (JP) ................. 2017-122339
Jun. 27, 2017   (JP) ................. 2017-125259

(51) Int. Cl.
  *H01S 5/34*     (2006.01)
  *H01S 5/022*    (2006.01)
  (Continued)

(52) U.S. Cl.
  CPC ............ *H01S 5/3401* (2013.01); *H01S 5/028* (2013.01); *H01S 5/02208* (2013.01);
  (Continued)

(58) Field of Classification Search
  CPC ....... H01S 5/3401–5/3402; H01S 5/16–5/168; H01S 5/22–5/24; H01S 5/0226;
  (Continued)

(56) References Cited

U.S. PATENT DOCUMENTS

| | | | | |
|---|---|---|---|---|
| 4,751,710 A | * | 6/1988 | Yamaguchi | H01S 5/0264 372/44.01 |
| 5,180,685 A | * | 1/1993 | Yamamoto | H01L 33/0062 148/DIG. 72 |

(Continued)

FOREIGN PATENT DOCUMENTS

| | | | | |
|---|---|---|---|---|
| DE | 102008045980 A1 | * | 6/2010 | ............. B82Y 20/00 |
| DE | 102015116335 A1 | * | 3/2017 | ........... H01S 5/0421 |

OTHER PUBLICATIONS

S.R. Darvish, et al., "High-power, continuous-wave operation of distributed-feedback quantum-cascade lasers at λ 7.8 μm", *Applied Physics Letters*, 89, 251119 (2006).

(Continued)

*Primary Examiner* — Joshua King
(74) *Attorney, Agent, or Firm* — Smith, Gambrell & Russell, LLP

(57) ABSTRACT

A quantum cascade laser includes: a semiconductor substrate including principal and back surfaces; a semiconductor laminate having a laminate end face, the laminate end face and, the substrate end face extending along a reference plane intersecting a second direction that intersects the first direction; a first electrode disposed on the semiconductor laminate, the semiconductor laminate being disposed between the first electrode and the semiconductor substrate; a second electrode disposed on the back surface; a first insulating film disposed on the laminate end face, the substrate end face, and the first electrode; a metal film disposed on the first insulating film and the laminate end face, the substrate end face, and the first electrode; and a second insulating film disposed on the second electrode, and on the substrate end face, the metal film being disposed between the first insulating film and the second insulating film.

13 Claims, 22 Drawing Sheets

(51) Int. Cl.
*H01S 5/028* (2006.01)
*H01S 5/227* (2006.01)
*H01S 5/343* (2006.01)
*H01S 5/12* (2006.01)
H01S 5/02 (2006.01)
H01S 5/042 (2006.01)
H01S 5/40 (2006.01)
H01S 5/22 (2006.01)

(52) U.S. Cl.
CPC ............ *H01S 5/02268* (2013.01); *H01S 5/12* (2013.01); *H01S 5/227* (2013.01); *H01S 5/3402* (2013.01); *H01S 5/343* (2013.01); H01S 5/0201 (2013.01); H01S 5/0202 (2013.01); H01S 5/0282 (2013.01); H01S 5/02272 (2013.01); H01S 5/0425 (2013.01); H01S 5/2224 (2013.01); H01S 5/2275 (2013.01); H01S 5/4031 (2013.01); H01S 2301/176 (2013.01)

(58) Field of Classification Search
CPC ........ H01S 5/02272; H01S 5/02236–5/02276; H01S 5/028–5/0288; H01S 5/02469; H01S 5/02484; H01S 5/02476; H01S 5/02492
See application file for complete search history.

(56) References Cited

U.S. PATENT DOCUMENTS

| | | | | |
|---|---|---|---|---|
| 5,677,922 A * | 10/1997 | Hayafuji | ................ | B82Y 20/00 372/46.01 |
| 5,943,553 A * | 8/1999 | Spaeth | ................ | H01L 33/641 372/107 |
| 6,289,030 B1 * | 9/2001 | Charles | ............ | H01L 31/02161 257/437 |
| 6,326,646 B1 * | 12/2001 | Baillargeon | ........... | B82Y 20/00 257/94 |
| 6,355,505 B1 | 3/2002 | Maeda et al. | | |
| 6,647,047 B2 * | 11/2003 | Yokota | ................ | H01S 5/0281 372/49.01 |
| 6,710,375 B2 * | 3/2004 | Oshima | ................ | H01S 5/0281 257/21 |
| 9,184,563 B1 * | 11/2015 | Raring | ................ | H01S 5/2201 |
| 2003/0035453 A1 * | 2/2003 | Fitz | .......... | H01S 5/028 372/49.01 |
| 2004/0238810 A1 | 2/2004 | Dwilinski et al. | | |
| 2004/0101013 A1 * | 5/2004 | Yokota | ................ | H01S 5/028 372/46.013 |
| 2004/0233950 A1 * | 11/2004 | Furukawa | ............... | H01S 5/028 372/43.01 |
| 2005/0151150 A1 * | 7/2005 | Choi | .................... | H01S 5/0425 257/99 |
| 2006/0239321 A1 * | 10/2006 | Kume | ................... | B82Y 20/00 372/50.121 |
| 2006/0274804 A1 * | 12/2006 | Behfar | .................. | H01S 5/028 372/49.01 |
| 2009/0067464 A1 * | 3/2009 | Tanaka | ................... | B82Y 20/00 372/45.011 |
| 2009/0086782 A1 | 4/2009 | Yokoyama et al. | | |
| 2013/0028280 A1 * | 1/2013 | Hongo | ............... | H01S 5/02461 372/44.01 |
| 2013/0107534 A1 * | 5/2013 | Avramescu | ......... | H01S 5/02461 362/259 |
| 2013/0250994 A1 | 9/2013 | Moenster et al. | | |
| 2013/0301666 A1 * | 11/2013 | Stagarescu | ............ | H01S 5/3013 372/44.01 |
| 2013/0322480 A1 | 12/2013 | Edamura et al. | | |
| 2014/0211819 A1 * | 7/2014 | Yoshida | .............. | H01S 5/02272 372/36 |
| 2014/0239250 A1 * | 8/2014 | Fang | ....................... | H01L 33/06 257/13 |
| 2014/0348196 A1 * | 11/2014 | Yoshinaga | ............ | H01S 5/3401 372/45.01 |
| 2015/0117484 A1 | 4/2015 | Sugiyama et al. | | |
| 2018/0069374 A1 | 3/2018 | Kakuno et al. | | |

OTHER PUBLICATIONS

Manijeh Razeghi, "High-Performance InP-Based Mid-IR Quantum Cascade Lasers", *IEEE Journal of Selected Topics in Quantum Electronics*, vol. 15, No. 3, p. 941-p. 951, May/Jun. 2009.
Office Action for U.S. Appl. No. 16/011,818 dated Mar. 20, 2019
Notice of Allowance for U.S. Appl. No. 16/006,666 dated Apr. 13, 2019.
Notice of Allowance for U.S. Appl. No. 16/006,666 dated Apr. 3, 2019.

* cited by examiner

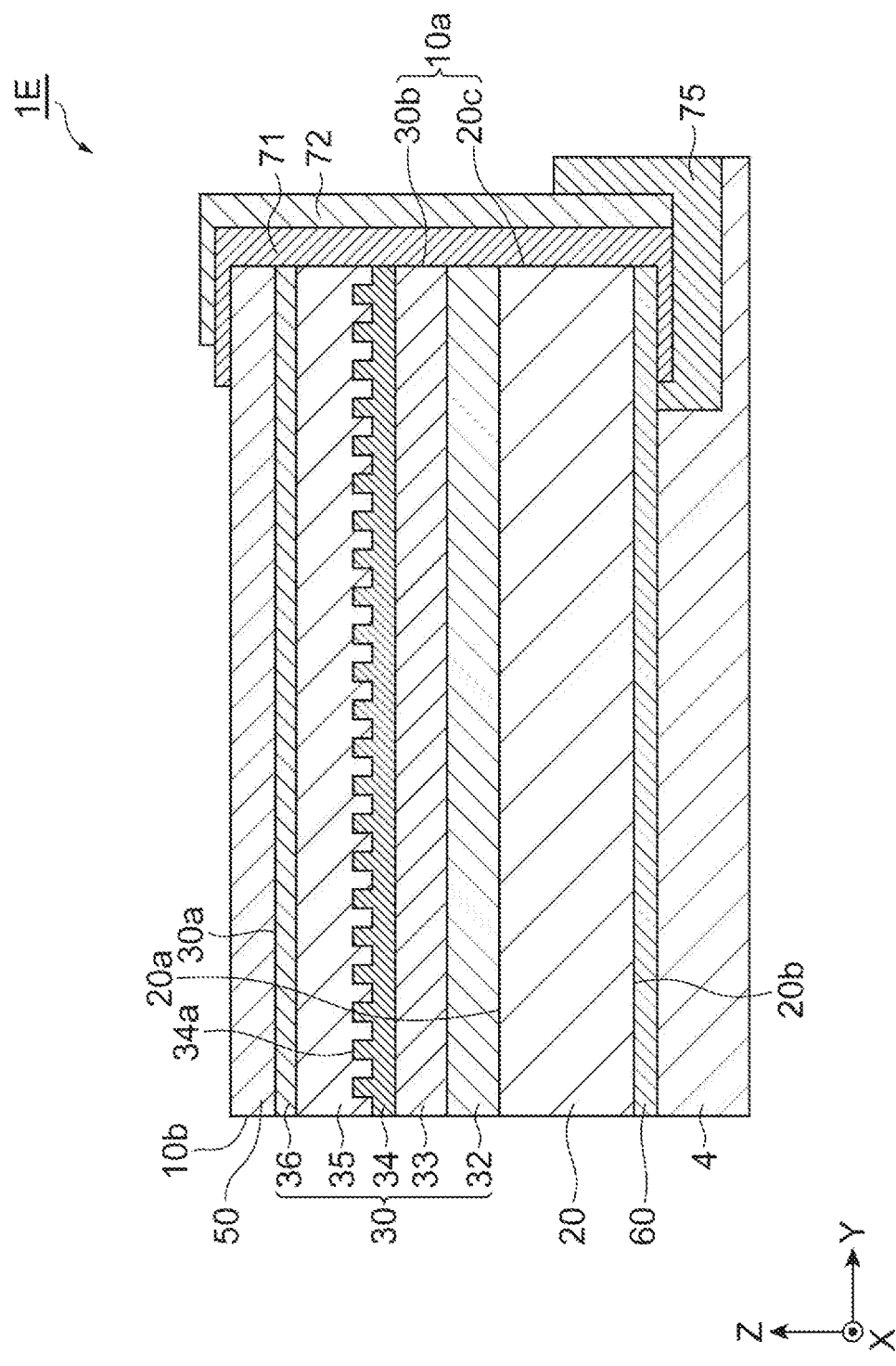

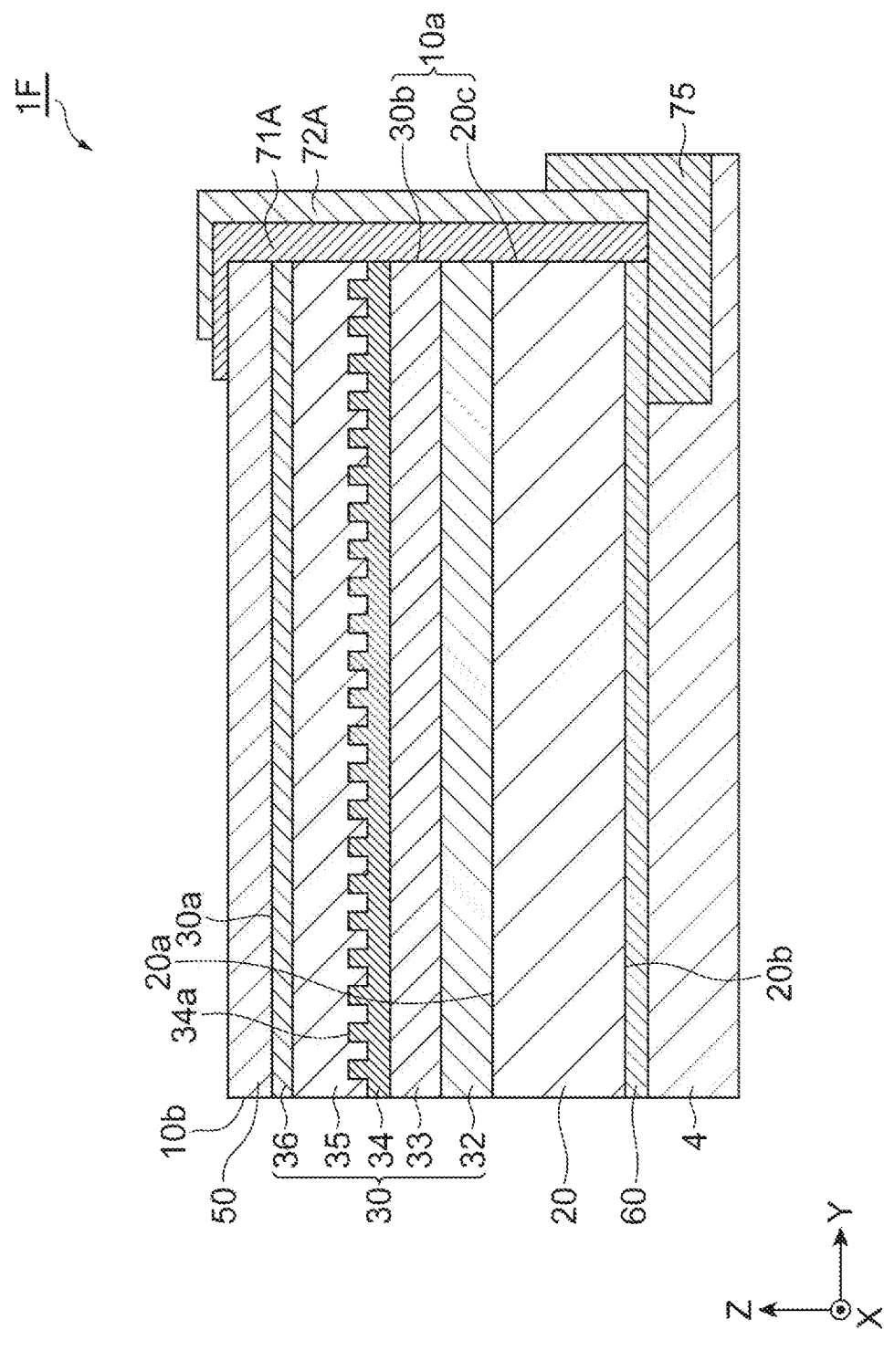

QUANTUM CASCADE LASER

BACKGROUND OF THE INVENTION

Field of the Invention

The present invention relates to a quantum cascade laser. This application claims the benefit of priorities from Japanese Patent Application No. 2017-122339 filed on Jun. 22, 2017 and Japanese Patent Application No. 2017-125259 filed on Jun. 27, 2017, which are herein incorporated by reference in their entirety.

Related Background Art

Non-Patent Document (S. R. Darvish, et al. "High-power, continuous-wave operation of distributed-feedback quantum-cascade lasers at λ 7.8 µm", Applied Physics Letters 89, 251119, 2006) discloses a quantum cascade laser.

SUMMARY OF THE INVENTION

A quantum cascade laser according to one aspect of the present invention includes a semiconductor substrate having a principal surface, a back surface, and a substrate end face, the principal surface and the back surface being arranged in a first direction, the principal surface being opposite to the back surface, the substrate end face extending along a reference plane intersecting a second direction, and the second direction intersecting the first direction; a semiconductor laminate disposed on the principal surface of the substrate, the semiconductor laminate having an upper surface and a laminate end face, the semiconductor laminate including a core layer extending from the laminate end face in the second direction, and a cladding layer disposed on the core layer, and the laminate end face extending along the reference plane; a first electrode disposed on the semiconductor laminate, the semiconductor laminate being disposed between the first electrode and the semiconductor substrate; a second electrode disposed on the back surface of the substrate; a first insulating film disposed on the laminate end face, the substrate end face, and the first electrode; a metal film disposed on the first insulating film and the laminate end face, the substrate end face, and the first electrode; and a second insulating film disposed on the second electrode, and on the substrate end face, the metal film being disposed between the first insulating film and the second insulating film.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 18 is a perspective view showing a quantum cascade semiconductor laser according to a third modified embodiment FIG. 19 is a perspective view showing a quantum cascade semiconductor laser according to another third modified embodiment.

DESCRIPTION OF THE EMBODIMENTS

Figure 1:
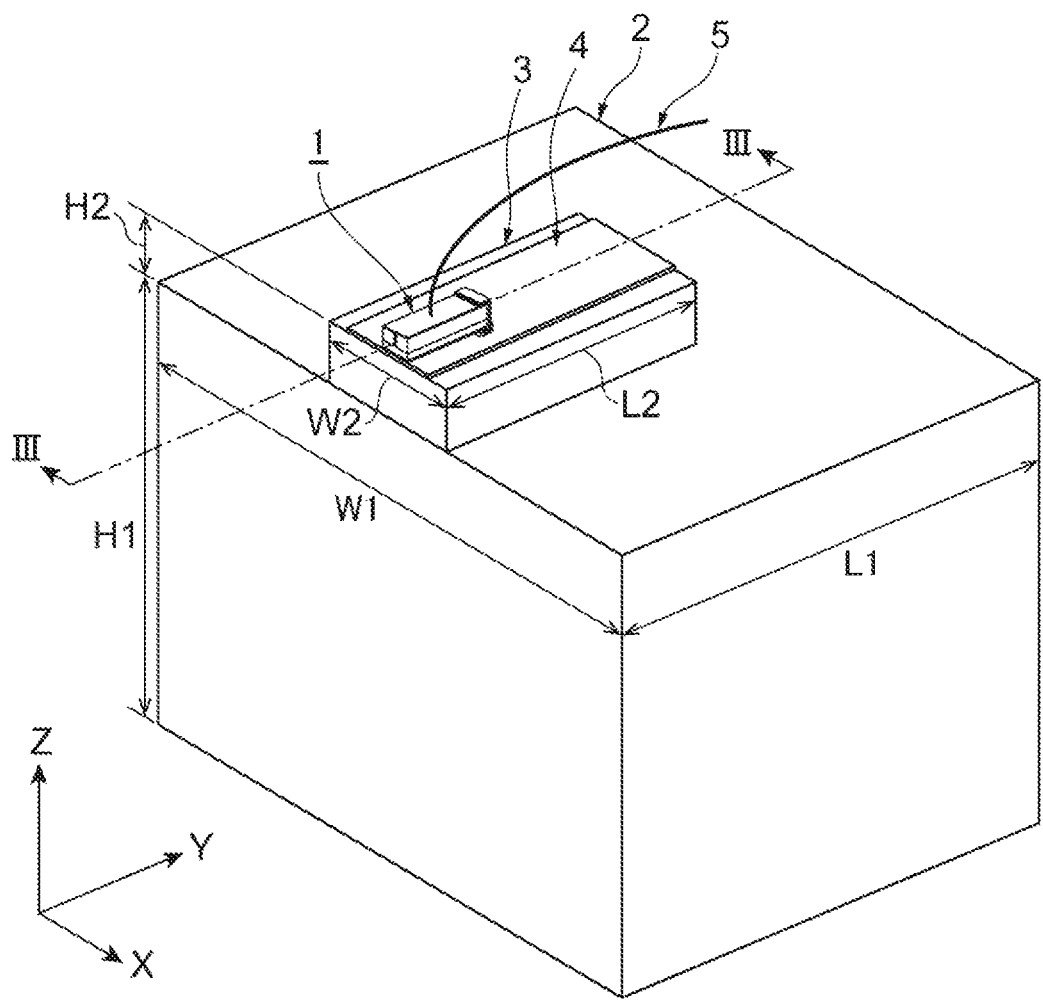
FIG. 1 is a perspective view showing a quantum cascade semiconductor laser, which is die-bonded, according to an embodiment.

A quantum cascade laser includes a lower electrode, a semiconductor substrate, a semiconductor laminate, and an upper electrode, which are arranged to form a device structure. The quantum cascade laser further has a metal film for the lasing cavity and an insulating film on the end face with the insulating film disposed between the metal film and the end face. The insulating film is made of $SiO_2$, and the metal film is made of Au. This quantum cascade laser is mounted on an electronic component with solder.

The quantum cascade laser is provided with the laser cavity associated with the end face, and may have a reflective film made of a metal film, which is formed on the end face, making the reflectance at the end face enhanced. A metal film making direct contact with the end face including end faces of semiconductor layers of the semiconductor device causes short circuit at the end face. The quantum cascade laser is provided with an insulating film, which is disposed between the end face and the metal film, to isolate the metal film from the end face. The insulating film and the metal film are sequentially formed on the end face by supplying respective raw materials toward the end face, thereby providing the quantum cascade laser with the insulating film and the metal film on the end face. In forming these films, the raw materials that miss the end face fly along the upper and lower electrodes to form deposited materials on these electrodes. This quantum cascade laser can be mounted on the electronic component, for example, with solder material, so that the deposited metallic material on the lower electrode comes in contact with the solder material. The quantum cascade laser thus mounted, which causes the solder material to connect the lower electrode to the metallic deposited material, receives a voltage (for example, a voltage of 10 volts or more) applied between the upper and lower electrodes for lasing, so that the high voltage is also applied to the metal film. This high voltage on the metal film is finally applied to the insulating film between the upper electrode and the deposited metallic material on the upper electrode.

The deposited material for the insulating film, however, has an extremely small thickness on the upper electrode, which is smaller than (as small as, for example, about one severalth of) that of the insulating film on the end face. The application of a high voltage, for example, 10 volts or more to the extremely thin deposited material between the upper electrode and the metal film on the upper electrode may break down the extremely thin deposited material in the vicinity of the end face to form a broken-down portion, and causes a large amount of current (referred to as inrush current) to flow through the broken-down portion in the deposited material, leading to device failures, such as breakdown of the end face, in the quantum cascade laser.

Forming a thick deposited material on the upper electrode makes the insulating film on the end face thick (for example, a thickness several times larger than the target thickness). This thick insulating film needs a long deposition time, resulting in reduction in the productivity of the quantum cascade laser. Further, the thick insulating film on the end face may produce an additional stress to the end face, resulting in deterioration of the end face in quality, and occurrence of cracking and/or peeling of the insulating film.

It is an object of the one aspect of the present invention to provide a quantum cascade laser, which has an insulating film and a metal film stacked on an end face, capable of reducing the occurrence of breakdown of the insulating film.

A description will be given of embodiments according to the above aspect below.

A quantum cascade laser according to an embodiment includes: (a) a semiconductor substrate having a principal surface, a back surface, and a substrate end face, the principal surface and the back surface being arranged in a first direction, the principal surface being opposite to the back surface, the substrate end face extending along a reference plane intersecting a second direction, and the second direction intersecting the first direction; (b) a semiconductor laminate disposed on the principal surface of the substrate, the semiconductor laminate having an upper surface and a laminate end face, the semiconductor laminate including a core layer extending from the laminate end face in the second direction, and a cladding layer disposed on the core layer, and the laminate end face extending along the reference plane; (c) a first electrode disposed on the semiconductor laminate, the semiconductor laminate being disposed between the first electrode and the semiconductor substrate; (d) a second electrode disposed on the back surface of the substrate; (e) a first insulating film disposed on the laminate end face, the substrate end face, and the first electrode; (f) a metal film disposed on the first insulating film and the laminate end face, the substrate end face, and the first electrode; and (g) a second insulating film disposed on the second electrode, and on the substrate end face, the metal film being disposed between the first insulating film and the second insulating film.

In the quantum cascade semiconductor laser described above, the second electrode is mounted, for example, on an electronic component with a solder material, and the application of a voltage (for example, a high voltage of 10 volts or more) to the first and second electrodes allows the quantum cascade semiconductor laser to lase. The solder material may come into contact with the metal film, and this contact results in that the voltage on the second electrode is applied to the metal film via the solder material. The solder material causes the first insulating film between the metal film and the first electrode to receive the voltage. The quantum cascade semiconductor laser is provided with the second insulating film on the laminate end face and the second electrode so as to cover the metal film, so that the second insulating film spaces the metal film apart from the solder material. The addition of the second insulating film can isolate the metal film from the solder material, so that the metal film does not make contact with the second electrode and the solder material. The quantum cascade semiconductor laser can prevent the first insulating film between the first electrode and the metal film on the first electrode from receiving the applied voltage, thereby avoiding the breakage of the first insulating film due to the applied voltage. This results in that the quantum cascade semiconductor laser can avoid the deterioration of the device performances.

In the quantum cascade laser according to an embodiment, the second insulating film may have an end on the substrate end face. In the quantum cascade laser according to an embodiment, the second insulating film may be disposed on the first electrode.

This second insulating film can enhance the mechanical strength of the first insulating and metal films.

In the quantum cascade laser according to an embodiment, the upper surface of the semiconductor laminate has a first area and a second area that are arranged in the second direction; the second area is disposed between the laminate end face and the first area; and the first electrode has a first thickness on the first area of the semiconductor laminate and a second thickness on the second area of the semiconductor laminate, and in the first electrode, the second thickness is smaller than the first thickness.

The quantum cascade laser is provided with the first electrode having a thin electrode portion in thickness, and in fabricating the quantum cascade laser with the partly-thinned first electrode, the partly-thinned first electrode makes it easy to conduct cleavage along a line on the thin electrode portion, resulting in an excellent yield. The first electrode has a first electrode portion with the first thickness and a second electrode portion with the second thickness smaller than the first thickness, so that the first electrode has a first sheet resistance in the first electrode portion and a second sheet resistance in the second electrode portion larger than the first sheet resistance. The partly-thinned first electrode can reduce a leakage current flowing in the vicinity of the rear end face, thereby enhancing the device performances (reducing the threshold current). The first electrode is disposed on the first area and is not disposed on the second area. The first electrode apart from the rear end face allows the quantum cascade laser to have advantageous effects as above.

In the quantum cascade laser according to an embodiment, the upper surface of the semiconductor laminate has a first area and a second area that are arranged in the second direction; the second area of the semiconductor laminate is disposed between the laminate end face and the first area of the semiconductor laminate; and the first electrode has an end apart from the laminate end face and the second area of the semiconductor laminate.

The quantum cascade laser according to an embodiment, the back surface of the semiconductor substrate has a first area and a second area that are arranged in the second direction; in the semiconductor substrate, the second area of the back surface is disposed between the substrate end face and the first area of the back surface; and the first electrode has a first thickness on the first area of the back surface and a second thickness on the second area of the back surface, and in the second electrode, the second thickness is smaller than the first thickness.

In the quantum cascade laser according to an embodiment, the back surface of the semiconductor substrate has a first area and a second area that are arranged to the second direction; in the semiconductor substrate, the second area of the back surface is disposed between the substrate end face and the first area of the back surface; and the second electrode has an end apart from the substrate end face and the second area of the back surface.

In the quantum cascade laser according to an embodiment, the back surface of the semiconductor substrate has a first area and a second area that are arranged to the second direction; in the semiconductor substrate, the second area of the back surface is disposed between the substrate end face and the first area of the back surface; and the second electrode has an end apart from the substrate end face and the second area of the back surface.

The quantum cascade laser is provided with the second electrode having a thin electrode portion in thickness, and in fabricating the quantum cascade laser with the partly-thinned first electrode, the partly-thinned first electrode makes it easy to conduct cleavage along a line on the thin electrode portion, resulting in an excellent yield. The second electrode has a first electrode portion with the first thickness and a second electrode portion with the second thickness smaller than the first thickness, so that the first electrode has a first sheet resistance in the first electrode portion and a second sheet resistance in the second electrode portion larger than the first sheet resistance. The partly-thinned second electrode can reduce makes a leakage current flowing in the vicinity of the rear end face, thereby enhancing the device performances (reducing the threshold current). The second electrode is disposed on the first area and is not disposed on the second area. The second electrode apart from the rear end face allows the quantum cascade laser to have advantageous effects as above.

The quantum cascade laser according to an embodiment further includes a third insulating film. The first electrode, the first insulating film, and the third insulating film are arranged in the first direction. The arrangement of the first and third insulating films allows an insulating region (including the first and third insulating films) to have a desired thickness between the first electrode and the metal film. The insulating region can make a dielectric strength enhanced and endures the voltage (a high voltage of 10 volts or more) for lasing, which may be applied between the first electrode and the metal film, thereby preventing the applied voltage from causing breakage of the insulating films, such as breakage of the end face.

In the quantum cascade laser according to an embodiment, the third insulating film includes at least one of $SiO_2$, SiON, SiN, alumina, a BCB resin, or a polyimide resin. These materials can provide the third insulating film of the quantum cascade semiconductor laser with an excellent durability and insulating properties, and allows the insulating film to work as a protective film for the laminate end face and the substrate end face. Films of the above materials can be formed on the laminate end face and the substrate end face by a dielectric film deposition, such as sputtering, CVD or spin coating, allowing easy introduction of the formation of the third insulating film into the process for fabricating a quantum cascade semiconductor laser.

The quantum cascade laser according to an embodiment further includes a fourth insulating film. The first insulating film and the metal film are disposed on the second electrode; the second electrode, the fourth insulating film, and the first insulating film are arranged in order in the first direction. The arrangement of the first and fourth insulating films allows an insulating region (including the first and fourth insulating films) to have a desired thickness between the first electrode and the metal film. The insulating region can make a dielectric strength enhanced and endures the voltage (a high voltage of 10 volts or more) for lasing, which may be applied between the first electrode and the metal film, thereby preventing the applied voltage from causing breakage of the insulating films, such as breakage of the end face.

In the quantum cascade laser according to an embodiment, the fourth insulating film includes at least one of $SiO_2$, SiON, SiN, alumina, a BCB resin, or a polyimide resin. These materials can provide the fourth insulating film of the quantum cascade semiconductor laser with an excellent durability and insulating properties, and allows the insulating film to work as a protective film for the laminate end face and the substrate end face. Films of the above materials can be formed on the laminate end face and the substrate end face by a dielectric film deposition, such as sputtering, CVD or spin coating, thereby allowing easy introduction of the formation of the fourth insulating film into the process for fabricating a quantum cascade semiconductor laser.

In the quantum cascade laser according to an embodiment, the metal film may not be disposed on the second electrode. Disposing the metal film apart from the second electrode reliably isolates the second electrode from the metal film. The quantum cascade semiconductor laser can prevent the first insulating film between the first electrode and the metal film on the first electrode from receiving the voltage for lasing, thereby avoiding the breakage due to the applied voltage, so that the quantum cascade semiconductor laser can avoid the deterioration of the device performances.

In the quantum cascade laser according to an embodiment, the first insulating film may not be disposed on the second electrode. The quantum cascade semiconductor, which allows both the metal and first insulating films to be apart from the second electrode, has the same advantageous effects as the embodiment In the quantum cascade laser according to an embodiment, the metal film includes gold.

In the quantum cascade laser according to an embodiment, each of the first and second insulating films includes at least one of $SiO_2$, SiON, SiN, alumina, a BCB resin, or a polyimide resin. These materials can provide the first and second insulating films of the quantum cascade semiconductor laser with an excellent durability and insulating properties, and allows the above insulating film to work as a protective film for the laminate end face and the substrate end face. Films of the above materials can be formed on the laminate end face and the substrate end face by a dielectric film deposition, such as sputtering, CVD or spin coating, thereby allowing easy introduction of the formation of the first and second insulating films into the process for fabricating a quantum cascade semiconductor laser.

In the quantum cascade laser according to an embodiment, the metal film includes an gold (Au) film. Using the gold (Au) film as the reflective film can provide the quantum cascade semiconductor laser with a high reflectance exceeding, for example, 90 percent at the laminate end face and the substrate end face.

In the quantum cascade laser according to an embodiment, the cladding layer includes InP. InP is a binary mixed crystal and is lattice-matched to an InP base, which allows the satisfactory crystal-growth of the InP layer thereon. InP has an excellent thermal conductivity, and allows the cladding layer to dissipate heat from the core layer. Using InP for the cladding layer can provide the quantum cascade laser with an excellent temperature characteristics.

In the quantum cascade laser according to an embodiment, the core layer includes active layers each working as a light emitting region, and injection layers each enabling injection of carriers into the respective active layers, and the active layers and the injection layers are alternately arranged in the first direction. The alternate arrangement of the active and injection layers allows an injection layer in the core layer to continuously and smoothly inject electrons therein into the active layer adjacent thereto and allows the adjacent active layer to emit light by subband transition in the conduction band, so that the cascading of the injection and the subband transition in the core layer allows the quantum cascade semiconductor laser to produce laser light, thereby enhancing the lasing characteristics In the quantum cascade laser according to an embodiment, each of the active layers and the injection layers each include a superlattice of GaInAs/AlInAs. The active and injection layers of GaInAs/AlInAs superlattices allow the core layer to lase in mid-infrared wavelengths (e.g., 3 to 20 micrometers) by means of electron transition between subbands in the conduction band.

The quantum cascade laser according to an embodiment, the semiconductor substrate includes an InP base. The quantum cascade semiconductor laser capable of producing light in mid-infrared region has a semiconductor laminate having lattice constants close to that of InP. Using an InP base as the semiconductor substrate allows the growth of the semiconductor laminate on the semiconductor substrate with excellent crystal quality. Further, the semiconductor substrate of InP, which is transparent to light in mid-infrared wavelengths, can function as a cladding layer.

Teachings of the present invention can be readily understood by considering the following detailed description with reference to the accompanying drawings shown as examples. Referring to the accompanying drawings, embodiments of a quantum cascade laser, and a method for fabricating a quantum cascade laser according to the present invention will be described below. To facilitate understanding, identical reference numerals are used, where possible, to designate identical elements that are common to the figures.

FIG. 1 is a perspective view showing a quantum cascade laser 1 according to an embodiment. For easy understanding, an XYZ coordinate system is depicted in FIG. 1, and in the present embodiment X-, Y-, and Z-axes are orthogonal to each other. The quantum cascade laser 1 may be provided with a distributed feedback type (DFB), which allows the quantum cascade laser 1 to lase in a single mode, for example, in a mid-infrared wavelength region of 3 to 20 micrometers. As shown in FIG. 1, the quantum cascade laser 1 is mounted on a submount 3, which is located on a carrier 2, with a solder material 4. Specifically, the quantum cascade laser 1 is die-bonded to the submount 3 with the solder material 4 in an epi-up manner (with the epi-surface upward). The quantum cascade laser 1 has a lower electrode electrically connected to the carrier 2 to the submount 3 and the solder material 4, and has an upper electrode connected to an end of a wiring conductor 5, which reaches a bonding pad to feed power to the quantum cascade laser 1. The upper electrode of the quantum cascade laser 1 is electrically connected to the pad electrode on the submount through the wiring conductor 5. The carrier 2 and the pad electrode are electrically connected to an external power supply. The application of a voltage from the external power supply between the upper and lower electrodes of the quantum cascade laser 1 turns on the quantum cascade laser 1 to cause current to flow into the quantum cascade laser 1, so that the quantum cascade laser 1 emits lasing light.

The carrier 2 has a width W1 in a range of, for example, 4 to 8 mm in the X direction; a length L1 in a range of, for example, 4 to 8 mm in the Y direction; and a thickness H1 in a range of, for example, 1 to 8 mm in the Z direction. The submount 3 has a length W2 in a range of, for example, 1 to 4 mm in the X direction; a length L2 in a range of 2 to 4 mm in the Y direction; and a thickness H2 in a range of, for example, 0.1 to 0.5 mm in the Z direction. The submount 3 may include AlN or CuW, and the carrier 2 may include Cu or CuW. The solder material 4 may include AuSn, indium (In) or silver paste, and the wiring conductor 5 may include Au.

Figure 2:
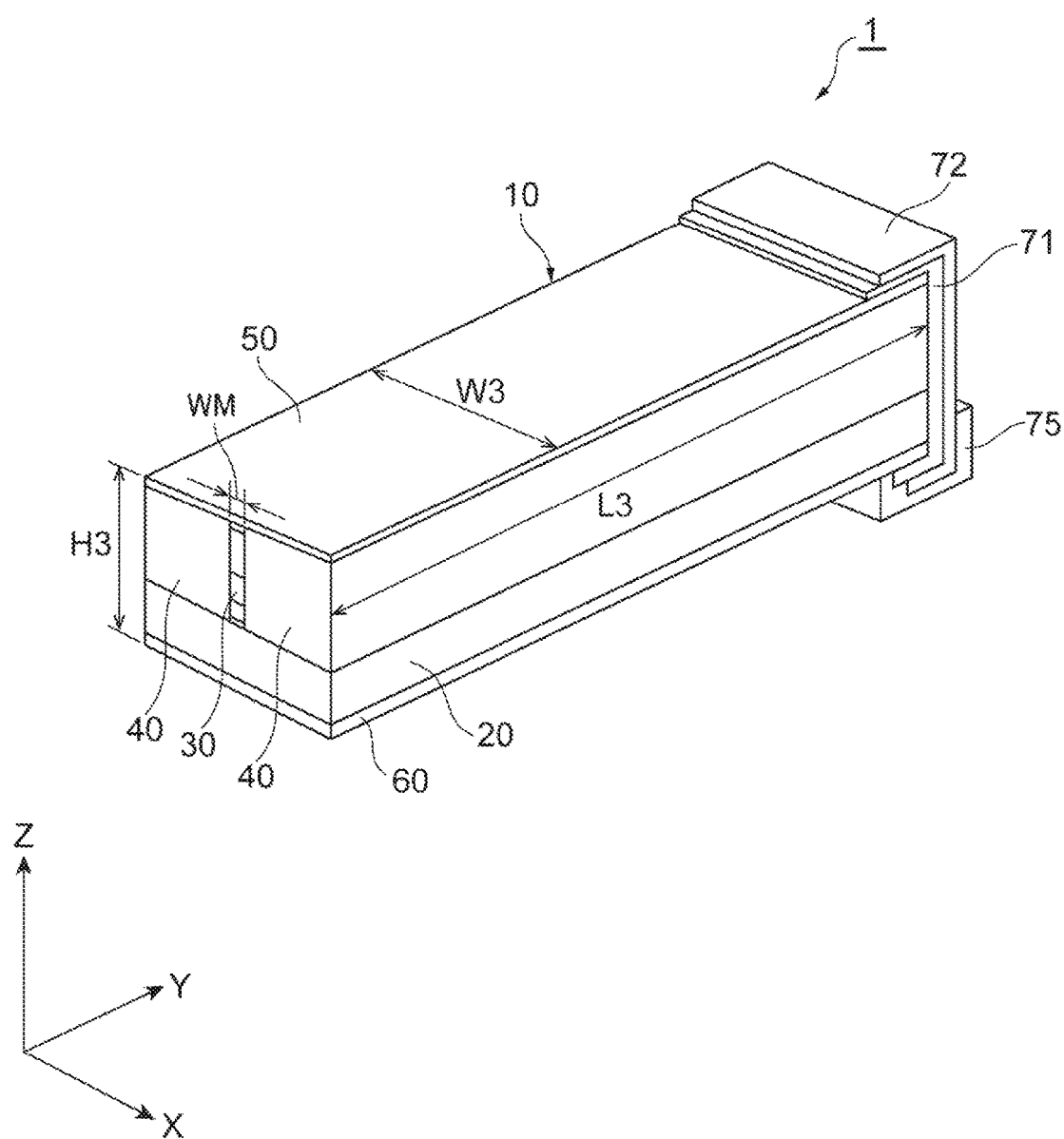
FIG. 2 is an enlarged perspective view showing the quantum cascade semiconductor laser as shown in FIG. 1.
Figure 3:
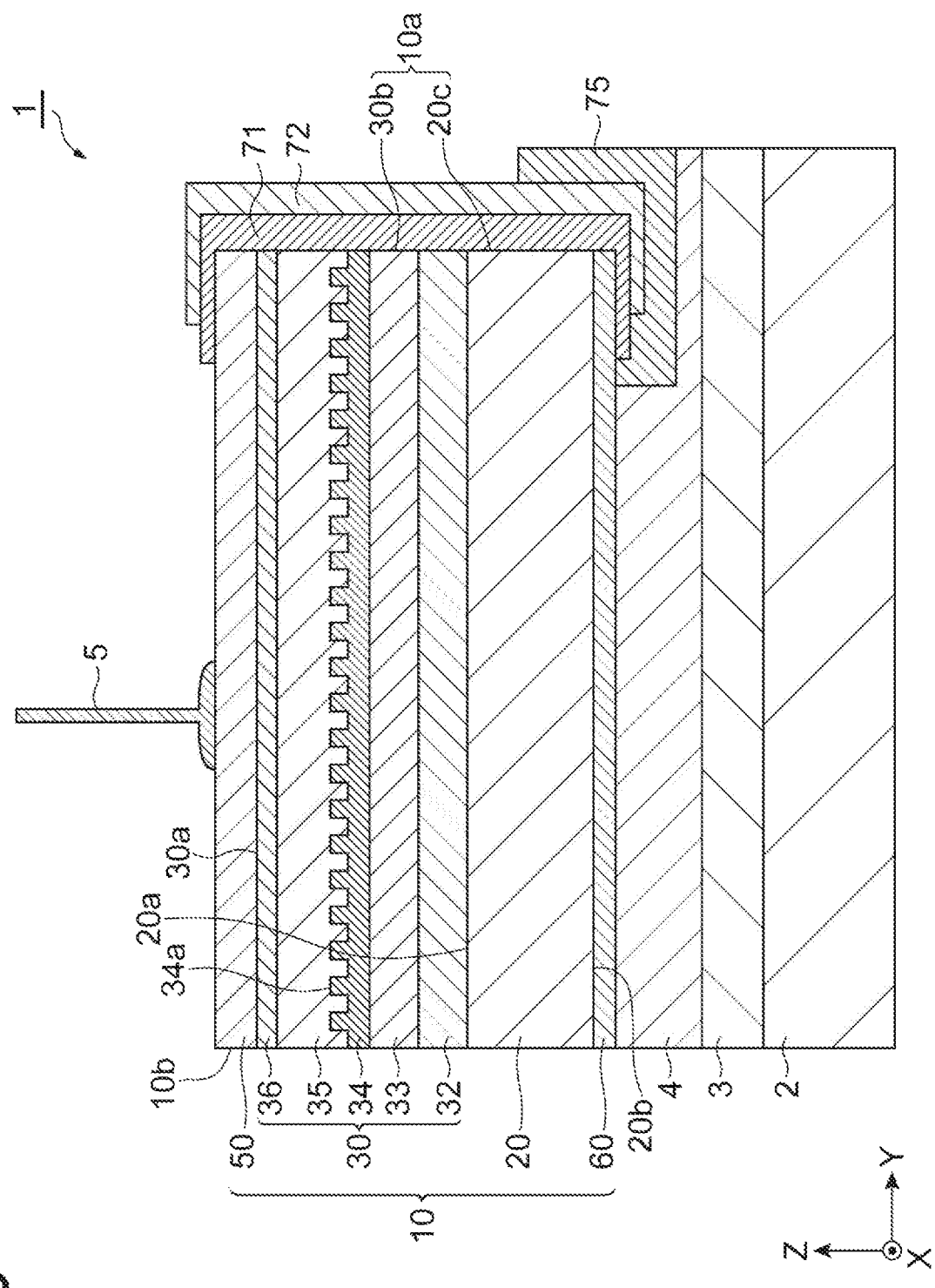
FIG. 3 is a cross sectional view taken along line III-III shown in FIG. 1.

FIG. 2 is a perspective view showing the quantum cascade laser 1 shown in FIG. 1. FIG. 3 is a cross sectional view taken along line III-III shown in FIG. 1. As shown in FIGS. 2 and 3, the quantum cascade laser 1 includes a semiconductor device portion 10, an insulating film 71 (a first insulating film), a metal film 72, and an insulating film 75 (a second insulating film). The semiconductor device portion 10 has a buried-heterostructure (BH) enabling confinement of current, which is referred to as a current confinement structure. The semiconductor device portion 10 has a strip-shaped mesa, which extends in a direction in which the waveguide mesa extends (e.g., the Y direction). The semiconductor device portion 10 has a length L3 in a range of, for example, 1 to 3 mm in the Y direction; a length W3 in a range of, for example, 400 to 800 micrometers in the X direction; and a length H3 (the thickness of the semiconductor device portion 10) in a range of, for example, 100 to 200 micrometers. The semiconductor device portion 10 has a rear end face 10a and a front end face 10b, which are opposite to each other in the Y direction. Further, the semiconductor device portion 10 includes a semiconductor substrate 20, a semiconductor laminate 30, two current block portions 40, an upper electrode 50 (referred to as a first electrode), and a lower electrode 60 (referred to as a second electrode).

As shown in FIG. 3, the quantum cascade laser 1 is mounted on the submount 3 such that the semiconductor substrate 20 is bonded thereto with the solder material 4. The semiconductor substrate 20 may be, for example, an n-type InP substrate. The semiconductor substrate 20 is conductive to allow current to flow through the semiconductor laminate 30 in applying a voltage between the upper and lower electrodes 50 and 60. In order to allow the quantum cascade laser 1 to use electrons as carriers, the semiconductor substrate 20 is provided with an n-type conductivity. The semiconductor substrate 20 can work as a lower cladding region with respect to the core layer 33. Alternatively, the quantum cascade laser can have a lower cladding layer between the semiconductor substrate 20 and the core layer 33, and does not require the semiconductor substrate 20 to work as a lower cladding region. The semiconductor substrate 20 includes a principal surface 20a, a back surface 20b, and a substrate end face 20c. The principal and back surfaces 20a and 20b are opposed to each other (in the Z direction). The principal surface 20a and the back surface 20b of the semiconductor substrate 20, and the submount 3 are arranged in order, for example, in the Z direction. The semiconductor substrate 20 has a thickness of, for example, 100 micrometers in the Z direction (defined as a distance between the principal surface 20a and the back surface 20b) in the Z direction. The substrate end face 20c intersects an axis extending, for example, in the Y direction (the second direction), and connects the principal and back surfaces 20a and 20b. The substrate end face 20c is included by the rear end face 10a.

The semiconductor laminate 30 is disposed on the principal surface 20a of the semiconductor substrate 20. The semiconductor laminate 30 has an upper surface 30a intersecting a direction of an axis extending, for example in the Z direction, a laminate end face 30b intersecting a direction of an axis extending, for example, in the Y direction, and a lower face, which is in contact with the principal surface 20a and is opposite to the upper surface 30a. The laminate end face 30b and the substrate end face 20c are arranged along a reference plane, which extends in a direction of an axis from the rear end face 10a to the front end face 10b. The rear end face 10a includes the end face 30b of the semiconductor laminate 30 in addition to the substrate end face 20c. The semiconductor laminate 30 has a mesa shape. The semiconductor laminate 30 has a strip-shape with a width WM defined in the X direction, and extends in a direction of an axis from the rear end face 10a to the front end face 10b, for example in the Y direction. The semiconductor laminate 30 includes end faces, which are opposite to each other in the Y direction, and side faces, which are opposite to each other in the X direction and are located apart from the respective sides of the quantum cascade laser 1 in the X direction. The end faces of the semiconductor laminate 30 may be provided to serve as mirrors and constitute the laser cavity of the quantum cascade laser 1. One of the end faces is included in the laminate end face 30b. The semiconductor laminate 30 includes a buffer layer 32, a core layer 33, a diffraction grating layer 34, an upper cladding layer 35, and a contact layer 36, which are sequentially arranged on the semiconductor substrate 20.

The buffer layer 32 and the upper cladding layer 35 can be made of, for example, n-type InP. The buffer layer 32 works along with the semiconductor substrate 20 to provide a lower cladding region for the core layer 33. The upper cladding layer 35 is disposed on the core layer 33 and the diffraction grating layer 34, which is between the core layer and the upper cladding layer. If needed, the core layer 33 is disposed directly on the principal surface 20a of the semiconductor substrate 20 without the buffer layer 32 in the semiconductor laminate 30. The core layer 33 extends along the direction of an axis extending from the laminate end face 30b toward the front end face, for example, in the Y direction. The core layer 33 includes multiple unit structures. The unit structures are arranged in the direction of an axis along which the core layer and the upper cladding layer are arranged (in the Z direction), thereby forming an array, and the adjoining unit structures in the array are in contact with each other. The array may include, for example, several tens of unit structures. The unit structures each include quantum well layers (several-nanometer thick) and barrier layers (several-nanometer thick), which are alternately arranged to form a superlattice, for example, in the Z direction. The quantum well layers each can include GaInAs or GaInAsP, and the barrier layers each can include AlInAs. Each unit structure has a single active layer and a single injection layer adjoining to each other. The active layers each work as a light emitting region to emit light. The injection layers each can deliver carriers to the adjacent active layer. The active layers and the injection layers are stacked along, for example. the Z direction to form a superlattice made of GaInAs/AlInAs.

The mechanism of optical emission of the quantum cascade laser 1 will be briefly described. The quantum cascade laser 1 uses a single kind of carriers, such as electrons, to emit light caused by optical transition of electrons between subbands of the conduction band in the active layers. The light produced by the emission is amplified in the lasing cavity of the quantum cascade laser 1, whereby the quantum cascade laser 1 emits laser light in mid-infrared wavelengths. Specifically, the quantum cascade laser 1 has the following three-level system in the conduction band in the active layer. First, an injection layer in the core layer injects electrons into the upper level of the active layer by tunneling. These electrons transition from the upper to lower levels of the active layer. This transition creates light having a wavelength of energy equal to its transition energy (the energy difference between the upper and lower levels of the sub-bands). The electrons in the lower level further makes a non-radiative transition to the bottom level in a short relaxation time by use of LO phonon scattering. As seen from the above description, the energy difference between the lower and bottom levels is designed to allow LO phonons to resonantly scatter the electrons. The non-radiative transition of electrons to the bottom level in a short relaxation time produces an inverted population of electrons between the upper and lower levels in the active layer. The electrons thus relaxed to the bottom level drift to the upper level of the active layer in the next stage by an electric field through the injection layer therebetween. Subsequently, the core layer in the quantum cascade laser 1 repeat the transitions and the deliveries, for example, several tens of times in the core layer to obtain a gain necessary for lasing. The quantum cascade laser 1 uses the quantum well layers and the barrier layers with their thicknesses and their material compositions appropriately selected to allow the adjustment of the energy difference between the upper and lower levels for lasing in infrared wavelengths, for example, in the range of 3 to 20 micrometers.

As shown in FIG. 3, the diffraction grating layer 34 has a diffraction grating 34a with a periodic surface structure of a period Λ, which has recesses and ridges alternately arranged in the Y direction. The diffraction grating 34a is formed as follows: forming a patterned resist of a period Λ on a film for the diffraction grating layer 34; and etching the film for the diffraction grating layer 34 with the patterned resist to form recesses and ridges, periodically arranged in the Z direction, for the diffraction grating. The diffraction grating of the period Λ can selectively reflect light of a wavelength equivalent to the period Λ, i.e., the Bragg wavelength, and the light thus reflected selectively is amplified by the lasing cavity, leading to lasing in the quantum cascade laser 1 in a single mode at the Bragg wavelength. The performance of the diffraction grating layer 34 is represented by a coupling coefficient indicating the magnitude of coupling between guided optical components going forward and backward in the lasing cavity. The diffraction grating 34a with a large coupling coefficient allows the quantum cascade laser 1 to satisfactorily produce a single-mode laser beam. The diffraction grating layer 34 is provided with semiconductor having a high refractive index, such as undoped or n-type GaInAs, to enable a large coupling coefficient.

Note that, if needed, the semiconductor laminate 30 excludes the contact layer 36, and otherwise a contact between the upper cladding layer 35 and the upper electrode 50 can provide a good ohmic contact. The contact layer 36 makes good ohmic contact with the upper electrode 50. The contact layer 36 is made of material having a small bandgap and lattice-matched to the semiconductor substrate 20, thereby forming a good ohmic contact. The contact layer 36 is made of, for example, n-type GaInAs.

As shown in FIG. 2, the semiconductor laminate 30 is embedded by the two current blocking portions 40 on both side faces thereof, and the current blocking portions 40 function as a current confinement layer constricting current (carriers) to the semiconductor laminate 30. The two current block portions 40 are disposed on the principal surface 20a of the semiconductor substrate 20 to cover both side faces of the semiconductor laminate 30. Each current block portion 40 includes undoped or semi-insulating semiconductor.

These undoped and semi-insulating semiconductors have high electrical resistance to carriers, such as electrons, and are available for material of the current block portion 40. The addition of a transition metal, such as Fe, Ti, Cr, and Co (dopant), to III-V compound semiconductor forms deep levels, which can trap electrons, in the forbidden band to provide host semiconductor with a semi-insulating property. The III-V compound semiconductor doped with the transition metal has a specific resistance of, for example, $10^5$ Ωcm or more to electrons, which is sufficiently high electric resistance. Iron (Fe) is an excellent transition metal to enable the semi-insulating property. An undoped semiconductor with a sufficiently high electric resistance to electrons can be used for the current block portions 40. Undoped or semi-insulating III-V compound semiconductor encompasses InP, GaInAs, AlInAs, GaInAsP, and/or AlGaInAs. These semiconductors are lattice matched to the semiconductor substrate 20, and are grown by a growth method, such as molecular beam epitaxy (MBE) and metalorganic vapor phase epitaxy (OMVPE).

The upper and lower electrodes 50 and 60 are arranged to supply current to the core layer 33. The upper and lower electrodes 50 and 60 each include, for example, Ti/Au, Ti/Pt/Au, or Au/Ge. The upper electrode 50 works as, for example, a cathode electrode, and is disposed on the upper surface 30a of the semiconductor laminate 30 (specifically, on the contact layer 36) and the current block portions 40. The lower electrode 60 works as, for example, an anode electrode, and is disposed on the back surface 20b of the semiconductor substrate 20 and is in contact with the solder material 4. The lower electrode 60 receives a positive potential with respect to the upper electrode 50.

If needed, an optical confinement layer may be disposed between the core layer 33 and the semiconductor substrate 20 and/or between the core layer 33 and the upper cladding layer 35. The optical confinement layer has a bandgap smaller than the bandgaps of the semiconductor substrate 20 and the upper cladding layer 35, and larger than that of the core layer 33. The optical confinement layer does not block electrons, and efficiently injects electrons from the buffer layer 32 to the core layer 33 therethrough. This magnitude relationship of these bandgaps allows the optical confinement layers each to have a refractive index larger than refractive indices of the semiconductor substrate 20 and the upper cladding layer 35, and smaller than that of the core layer 33. The semiconductor substrate 20 and the upper cladding layer 35, therefore, work to confine light, which is produced by the core layer 33, into the core layer 33 and the optical confinement layer, thereby enhancing the confinement of light into the core layer 33. In order to enhance confinement of light into the core layer 33, the optical confinement layer can be made of material that has a refractive index higher than the refractive indices of the semiconductor substrate 20 and the upper cladding layer 35 and is lattice matched to the semiconductor substrate 20. The optical confinement layer may include, for example, undoped or n-type GaInAs.

The insulating film 71 is disposed adjacent to the rear end face 10a of the semiconductor device portion 10. Specifically, the insulating film 71 has a thick portion on the rear end face 10a, and upper and lower thin portions, which extend along the upper and lower electrodes 50 and 60, respectively, and adjoin the thick portion. More specifically, the laminate end face 30b and the substrate end face 20c are entirely covered with the thick portion of the insulating film 71. The upper and lower electrodes 50 and 60 have end portions, which are covered with the upper and lower thin portions of the insulating film 71, at or close to the rear end face 10a. The thick portion of the insulating film 71 has a thickness, which is measured in the Y direction, on the rear face 10a larger than thicknesses of the upper and lower portions of the insulating film 71, each of which is measured in the Z direction, on the upper and lower electrodes 50 and 60, respectively. For example, the thickness of the insulating film 71 on the rear facet 10a is in a range of 100 to 200 nm, and the thicknesses of the insulating film 71 on the upper and lower electrodes 50 and 60 in the Z direction each are in a range of 20 to 30 nm. The insulating film 71 is made of a dielectric film including at least one of $SiO_2$, SiON, SiN, $Al_2O_3$ (alumina), BCB resin, or polyimide resin.

The metal film 72 is disposed on the substrate end face 20c and the laminate end face 30b with the insulating film 71 disposed between the metal film 72 and the substrate and laminate end faces 20c and 30b, and extends on the upper and lower electrodes 50 and 60. Specifically, the metal film 72 covers all of the substrate end face 20c and the laminate end face 30b, and covers respective end portions, which extend from the rear end face 10a, of the upper and lower electrodes 50 and 60. The insulating and metal films 71 and 72 have respective ends on the lower electrode 60. The end of the metal film 72 is closer to the rear end face 10a with respect to that of the insulating film 71 in the Y direction, and is not in contact with the lower electrode 60. The insulating film 71 can isolate the end of the metal film 72 from the lower electrode 60. The metal film 72 includes gold (Au), which provides the quantum cascade laser 1 with a reflectivity of 90 percent or more.

The insulating film 75 covers a part of the metal film 72. Specifically, the insulating film 75 is disposed such that the insulating and metal films 71 and 72 are between the substrate end face 20c and the insulating film 75, and covers a part of the metal film 72 (a part of the insulating film 71) on a part, close to the substrate end face 20c, of the lower electrode 60. Specifically, the substrate end face 20c includes a lower area, which is located close to the back surface 20b in the Z direction, and an upper area, which is disposed between the lower area and the principal surface 20a, located away from the back surface 20b in the Z direction. The lower and upper areas are arranged along an axis extending, for example, in the Z direction. The insulating film 75 has a first portion on the first area of the substrate end face 20c, and a second portion on the near zone, which is close to the substrate end face 20c, of the lower electrode 60. The insulating film 75 has an end, which is apart from the substrate end face 20c and is farther than the ends of the insulating and metal films 71 and 72 in a direction from the rear end face 10a to the front end face 10b, e.g., the Y direction, in contact with the lower electrode 60 to covers all the parts, located on the lower electrode 60, of the metal and insulating films 72 and 71. Covering the insulating and metal films 71 and 72 with the insulating film 75 on the near zone of the lower electrode 60 prevents the metal film 72 from making contact with the solder material 4. The insulating film 75 has a thickness of 100 to 300 nm, which is measured in a direction intersecting the back surface 20b, e.g., the Z direction, on the lower electrode 60 and the metal film 72, and the thickness of the insulating film 75 may be in a better range of 150 to 300 nm. The insulating film 75 is made of dielectric material, which may be the same as the insulating film 71 and alternatively may be different from the insulating film 71. The insulating film 75 is made of dielectric material, including at least one of $SiO_2$, SiON, SiN, alumina, BCB resin, or polyimide resin.

Figure 4A:
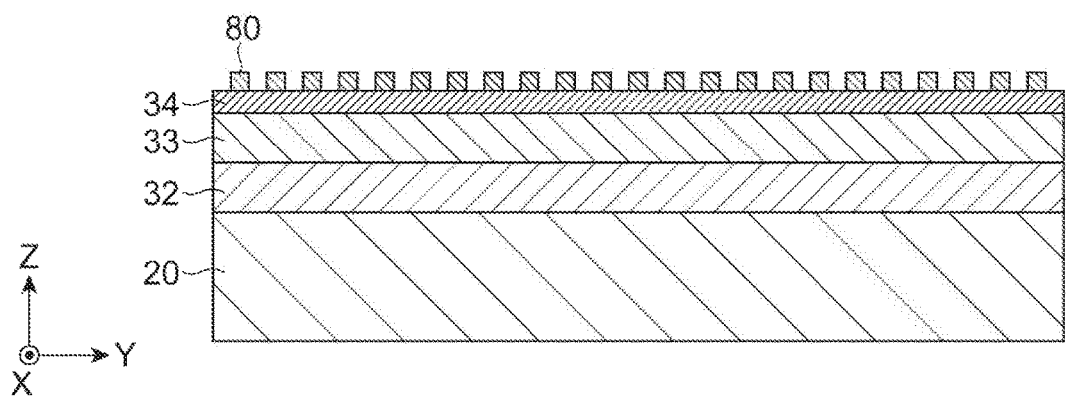
FIG. 4A is a schematic view showing a major process in the method for fabricating a quantum cascade semiconductor laser, shown in FIG. 1, according to the embodiment.
Figure 4B:
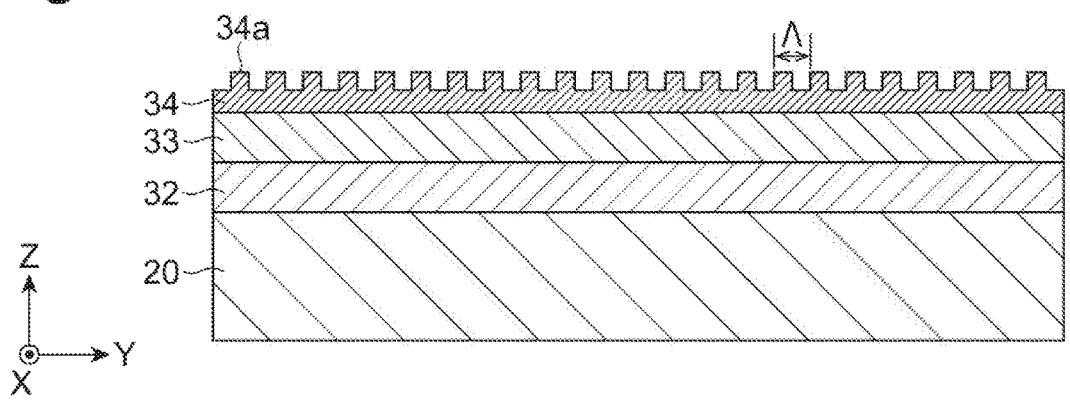
FIG. 4B is a schematic view showing a major process in the method according to the embodiment.

A description will be given of the method for fabricating the quantum cascade laser 1 of the above structure. FIGS. 4A to 4C, FIGS. 5A to 5C, FIG. 6, FIGS. 7A and 7B, and FIGS. 8A and 8B are schematic views each showing a major process in a method for fabricating the quantum cascade laser 1 shown in FIG. 1. FIGS. 4A to 4C and FIG. 6 are cross sectional views each taken along a line equivalent to line III-III of FIG. 1 and a plane parallel to the YZ plane, and FIGS. 5A to 5C are cross sectional views each parallel to the YZ plane. First, a wafer is prepared which will turn into the semiconductor substrate 20 in a later process. Then, in a first crystal growth step, the buffer layer 32, the core layer 33, and the diffraction grating layer 34 are grown in order on the principal surface of the wafer by a growth method, such as MBE and OMVPE, to form an epi-wafer. Thereafter, a resist mask 80 is formed by photolithography on the epi-wafer, in particular, the diffraction grating layer 34. As shown in FIG. 4A, the resist mask 80 has a pattern for the diffraction grating 34a. The pattern of the resist mask 80 has a width of Λ in the Y direction. The epi-wafer is etched with the resist mask 80 to produce, from the diffraction grating layer 34, the diffraction grating 34a with a periodic structure as shown in FIG. 4B.

Figure 4C:
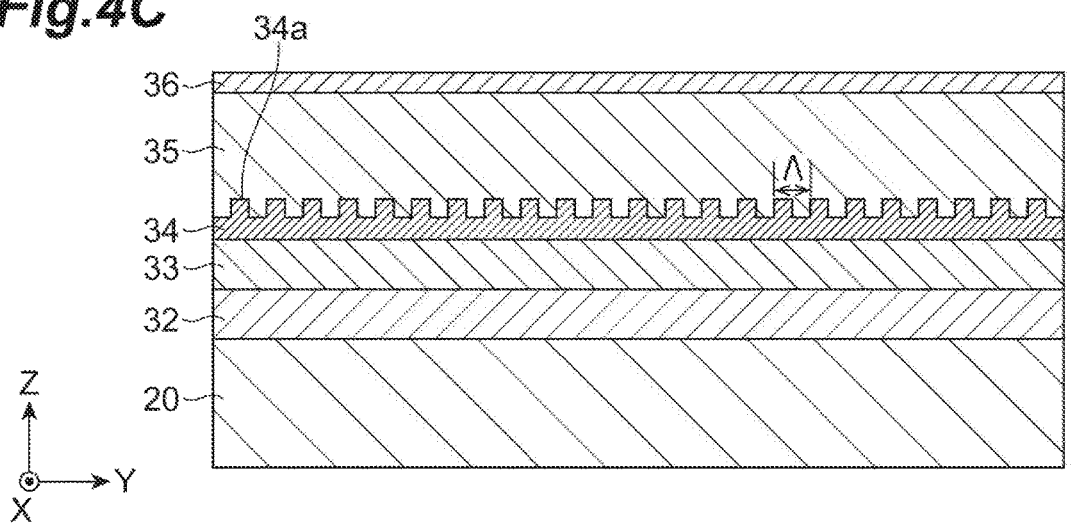
FIG. 4C is a schematic view showing a major process in the method according to the embodiment.
Figure 5A:
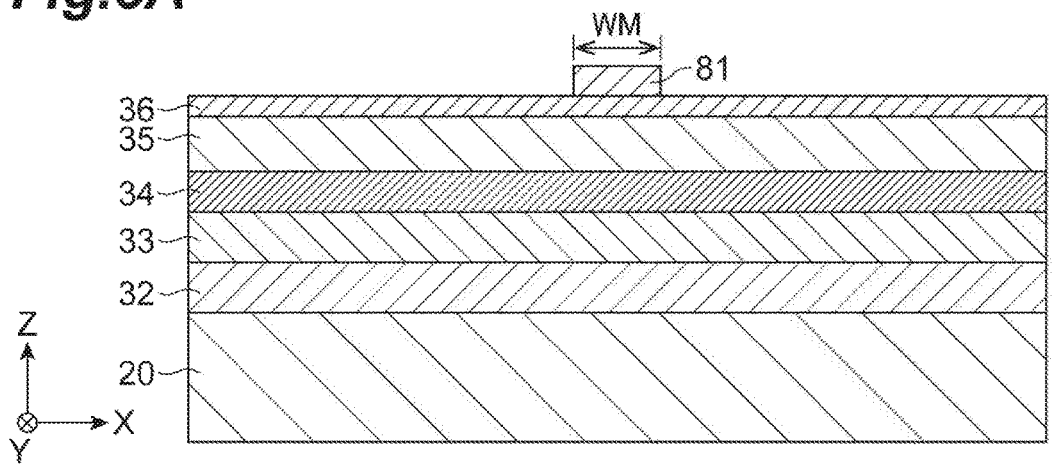
FIG. 5A is a schematic view showing a major process in the method according to the embodiment.
Figure 5B:
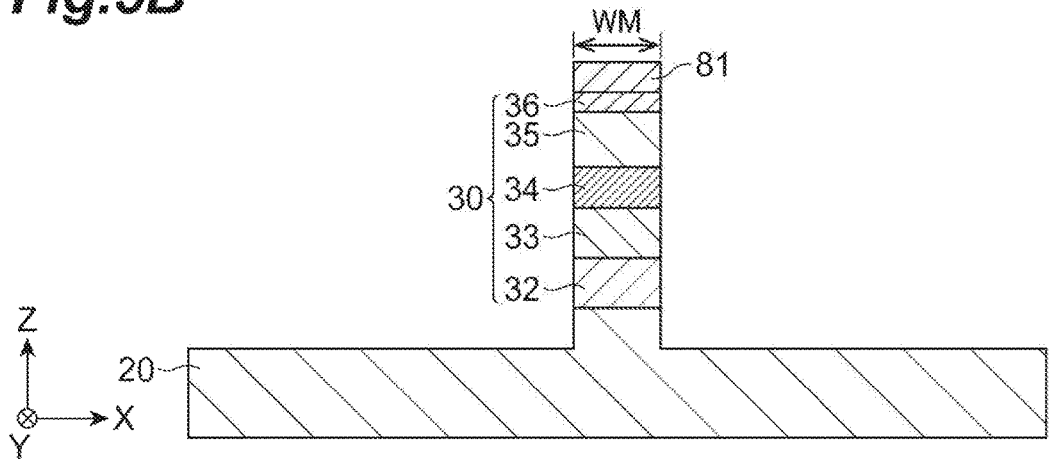
FIG. 5B is a schematic view showing a major process in the method according to the embodiment.
Figure 5C:
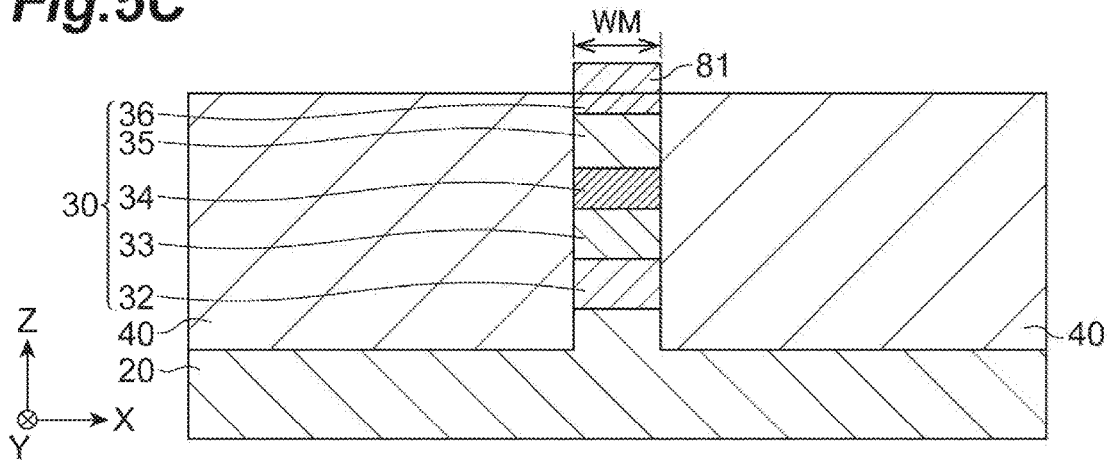
FIG. 5C is a schematic view showing a major process in the method according to the embodiment.

In a second crystal growth step, as shown in FIG. 4C, the upper cladding layer 35 and the contact layer 36 are grown in order on the diffraction grating layer 34. Next, as shown in FIG. 5A, a mask 81 defining the semiconductor laminate 30 is formed on the contact layer 36 by photolithography and etching. The mask 81 has a pattern of a width WM, which is measured in the X direction, extending in the Y direction in each of device sections for the semiconductor device portions 10, and the pattern is apart from boundaries between the device sections in the X direction. The mask 81 may include the same material as that of the insulating film 71, and specifically, be mode of a dielectric material, including at least one of SiN, SiON, alumina, and $SiO_2$.

An etching with the mask 81 forms the semiconductor laminate 30 having a mesa-shape as shown in FIG. 5B, and the semiconductor laminate 30 includes the contact layer 36, the upper cladding layer 35, the grating layer 34, the core layer 33, and the buffer layer 32, which are arranged in the Z direction. The etching may include dry etching and/or wet etching, and the dry etching can be used to form the semiconductor laminate 30. The dry etching can provide the semiconductor laminate layer 30 of the width WM with excellent verticality and high accuracy. The dry etching greatly affects the device performances of the quantum cascade laser 1. The dry etching may be, for example, reactive ion etching (RIE), and the reactive ion etching (RIE) uses plasma of etching gas.

Figure 6:
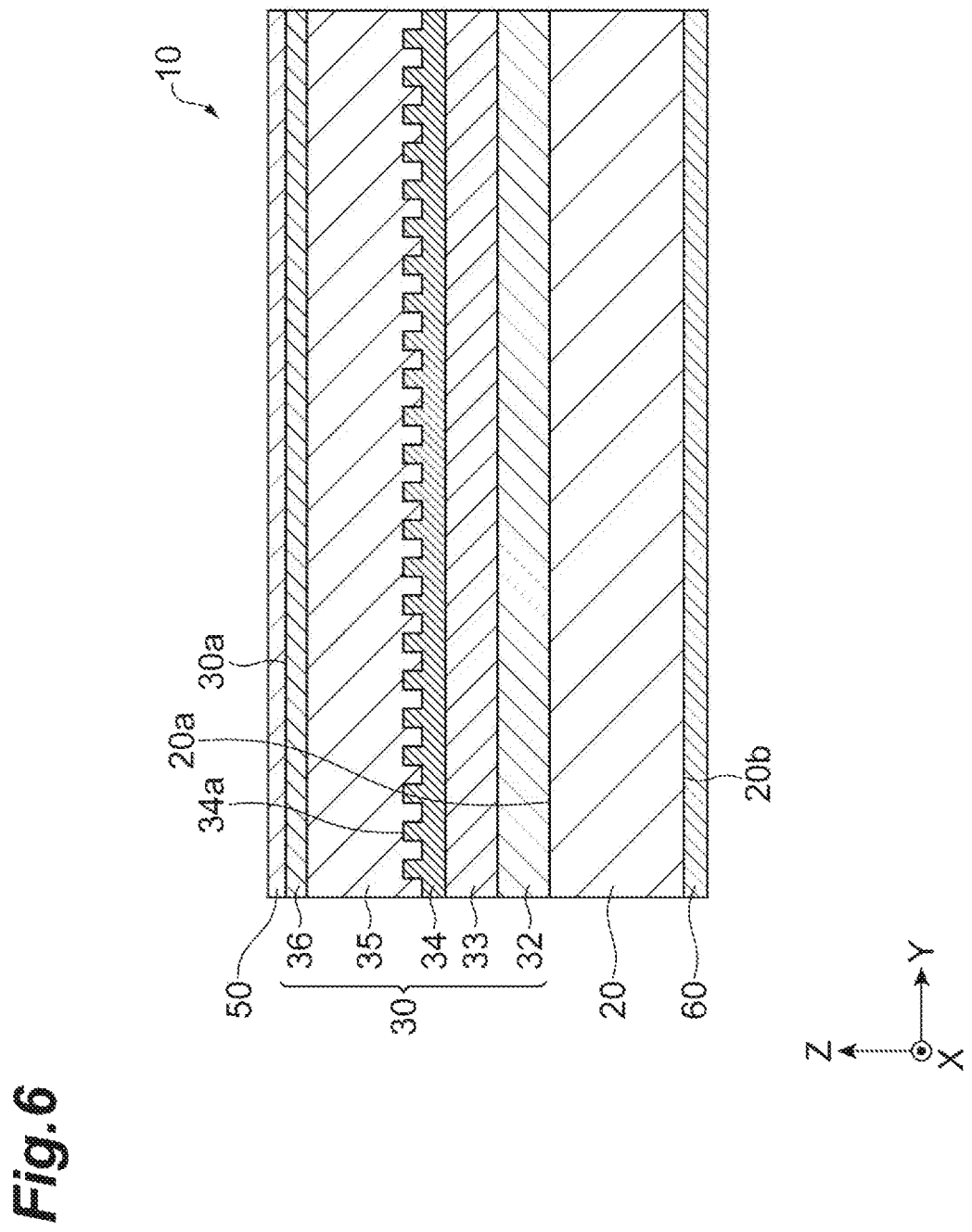
FIG. 6 is a schematic view showing a major process in the method according to the embodiment.

In a third crystal growth step, a semi-insulating semiconductor layer, such as InP doped with Fe, is grown with the mask 81 left on the semiconductor laminate 30. As shown in FIG. 5C, deposited material is hardly formed on the mask 81, and the semi-insulating semiconductor layer is grown on both sides of the semiconductor laminate 30 (grown between semiconductor laminates 30 formed by the removal of the semiconductors in the etching in FIG. 5B) so as to embed the semiconductor laminate 30. These two current block portions 40 are formed to embed the semiconductor laminate 30. After removing the mask 81, as shown in FIG. 6, the upper electrode 50 is formed on the upper surface 30a of the semiconductor laminate 30. After forming the upper electrode, the wafer is thinned by polishing to a thickness, which makes the cleavage of the wafer easy (for example, 100 to 200 micrometers), and then as shown in FIG. 6, the lower electrode 60 is formed on the back surface 20b of the thinned semiconductor substrate 20.

Figure 7A:
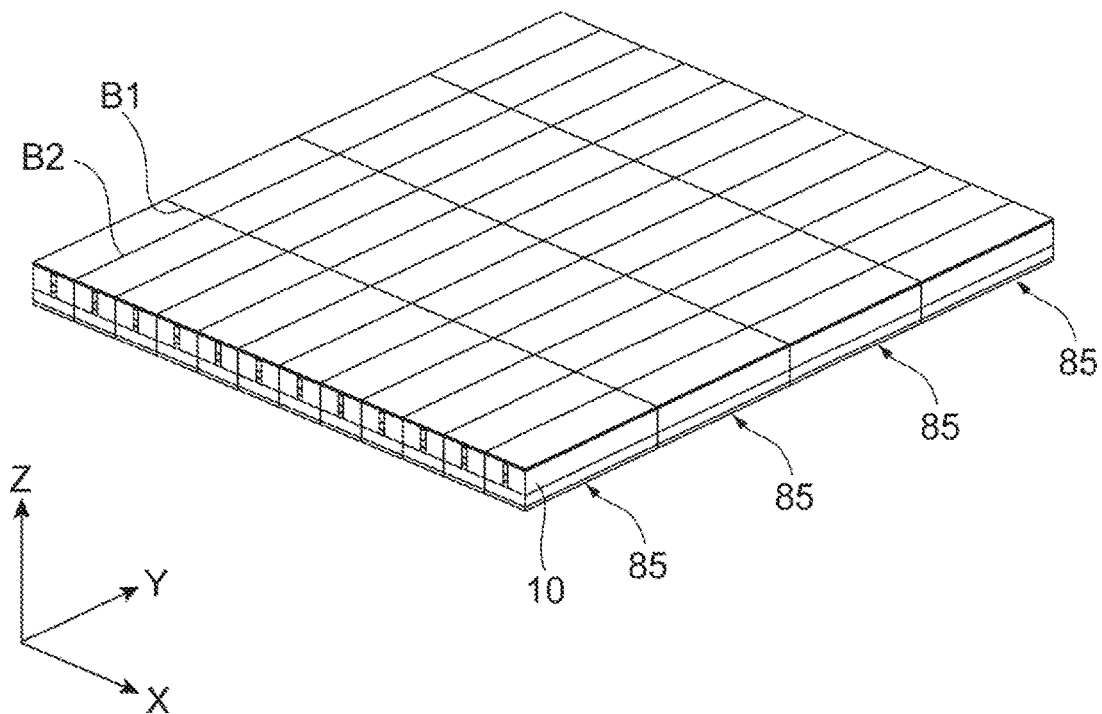
FIG. 7A is a schematic view showing a major process in the method according to the embodiment.
Figure 7B:
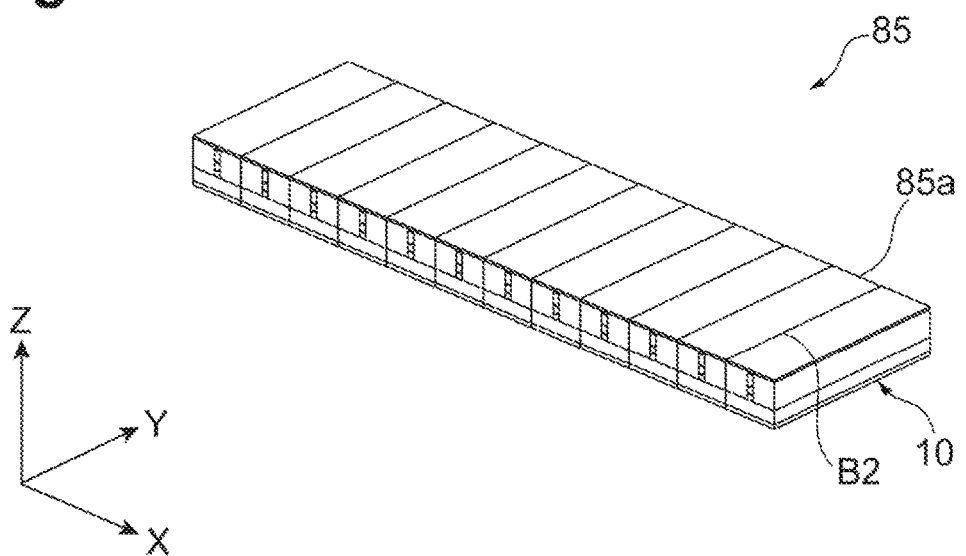
FIG. 7B is a schematic view showing a major process in the method according to the embodiment.

The above processes bring a wafer product to completion. FIG. 7A shows a wafer product including multiple devices sections for semiconductor device portions 10 of the quantum cascade lasers 1, which are arranged in the X and Y directions over the entire wafer. In FIG. 7A, boundary lines B1 and B2 between the device sections of the semiconductor device portions 10 are depicted and the wafer product are, finally, divided along the lines B1 and B2 to form the multiple the quantum cascade lasers 1 each having the semiconductor device portion 10. Specifically, the boundary lines B1 extend in the X direction and the boundary lines B2 extend in the Y direction. Then, the wafer product is separated by cleavage at the boundary lines B1 into chip bars each having the arrangement of multiple device sections for semiconductor device portions 10, e.g. a chip bar 85 as shown in FIG. 7B. The chip-bar 85 includes the device sections arranged along the X direction. The chip-bar 85 has an end face 85a including the arrangement of the rear end faces 10a of the quantum cascade lasers 1 in the X direction.

Figure 8A:
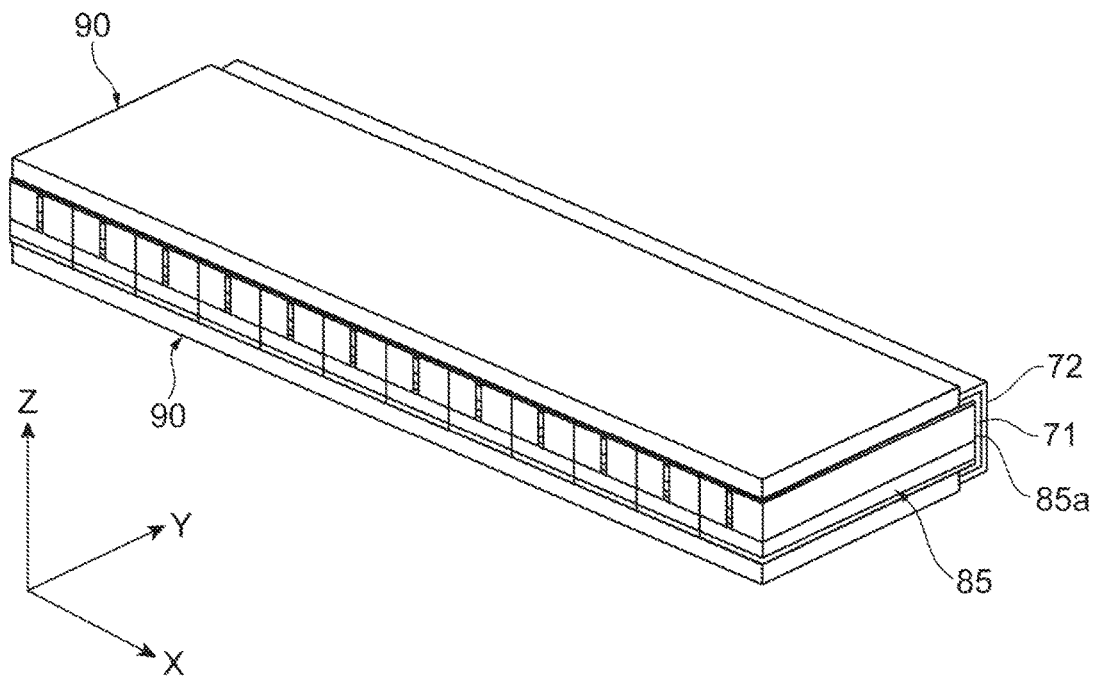
FIG. 8A is a schematic view showing a major process in the method according to the embodiment.

A description will be given of a process of forming the insulating film 71 on the end face 85a and the insulating film 72. First, as shown in FIG. 8A, two protectors 90 are prepared in order to form the insulating film 71 on a desired area of the chip bar 85, and the desired area includes the end face 85a of the chip bar 85. The protectors 90 each may have a thin plate of a rectangle, the longitudinal of which is oriented to the X direction as shown in FIG. 8A. One protector 90 is used to cover, except for the near zone of the upper electrode 50 close to the end face 85a of the chip bar 85, almost all the upper electrode 50, i.e., the far zone of the upper electrode 50, and not to cover any end face 85a. The one protector 90 has an end, which is located at the boundary between the near and far zones of the upper electrode 50, and the near and far zones are arranged in the Y direction. Another protector 90 is used to cover, except for the near zone of the lower electrode 60 close to the end face 85a of the chip bar 85, almost all the lower electrode 60, i.e., the far zone of the lower electrode 60, and not to cover any end face 85a. The other protector 90 has an end, which is located at the boundary between the near and far zones of the lower electrode 60, and the near and far zones are arranged in the Y direction. After attaching these protectors 90 to the chip bar, an insulating film 71 is formed on the end face 85a. Specifically, flux containing constituent atoms for the insulating film 71 is supplied toward the end face 85a, and the constituent atoms are deposited on the end face 85a, for example, by CVD or sputtering to form the film. The constituent atoms fly toward the end face 85a in the direction normal to the end face 85a. At this time, the constituent atoms that miss the end face 85a fly along both the upper and lower electrodes 50 and 60, and are deposited on parts of the upper and lower electrodes 50 and 60 included in the near zone of the chip bar 85, thereby forming the insulation film 71 thereon. The insulating film 71 is formed on the end face 85a and the near zone of the chip bar 85 to form a second wafer product. After forming the insulation film 71, the protectors 90 are detached from the chip bar.

A description will be given of a process of forming the metal film 72 on the end face 85a. Specifically, electron beam evaporation is used to deposit constituent atoms for the metal film 72, and a part of the constituent atoms miss the end face 85a to fly along the upper and lower electrodes 50 and 60. This evaporation can form the metal film 72 on the end face 85a and the insulating film 71, which covers the upper and lower electrodes 50 and 60 in the near zone of the chip bar 85. The protector 90 for forming the metal film 72 has a length in the Y direction longer than that of the protector 90 that is used to form the insulating film 71. The end of the metal film 72 is positioned closer to that of the insulating film 71 on the upper electrode 50 with respect to the end face 85a in the Y direction, so that the difference in position between these ends can prevent the metal film 72 from being in direct contact with the upper electrode 50 to form a short-circuit path.

Figure 8B:
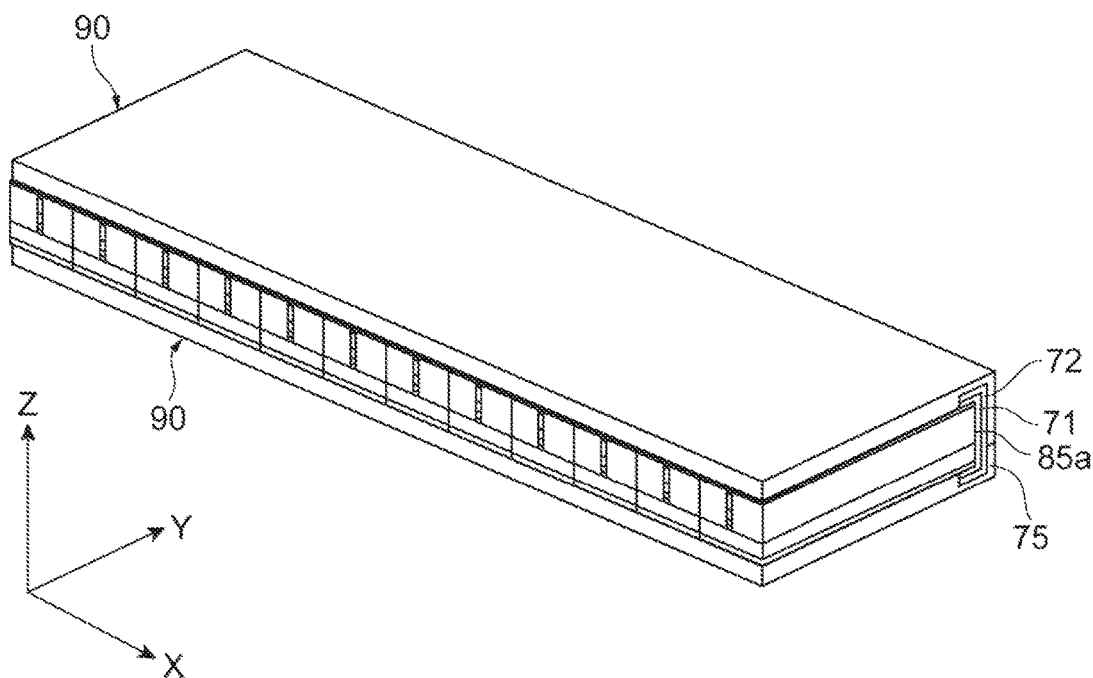
FIG. 8B is a schematic view showing a major process in the method according to the embodiment.

A description will be given of a process of forming the insulating film 75 on the end face 85a and the insulating film 72. First, as shown in FIG. 8B, one protector 90 and another protector 91 are prepared in order to form the insulating film 75 on a desired area of the chip bar 85. The one protector 90 covers the lower electrode 50, and the other protector 91 covers the entire upper electrode 60. The other protector 91 has a first portion of a plate-like shape and a second portion of a plate-like shape, the ends of which join to each other, and the first portion extends in the Y direction along its longitudinal direction to provide the other protector with an L-shape in cross section taken along a plane intersecting the Z direction. The other protector 91 is used in place of the protector 90, and covers the entire lower electrode 60 with the first portion thereof and a part, which is close to the upper electrode 50, of the end face 85a with the second portion thereof. After attaching the protector 90 and the other protector 91 to the chip bar 85 having the insulating and metal films 71 and 72 thereon, the insulating film 75 is formed on the insulating and metal films 71 and 72 on the end face 85a. The second portion of the other protector 91, i.e., the L-shaped bent portion, covers the upper area, close to the upper electrode 50 in the Z direction, of the end face 85a (including the laminate end face), so that the insulating film 75 thus deposited has an end at the position of the tip of the L-shaped bent portion.

After forming the insulating films 71, 72 and 75, the chip bar 85 thus formed is broken along the boundary lines B2 by cleavage (with reference to FIG. 7B) into the quantum cascade lasers 1 as shown in FIG. 1.

A description will be given of advantageous effects of the quantum cascade laser 1 according to the above-described embodiment. A quantum cascade laser is a promising light source that can be used in technical fields, such as environmental gas analysis, medical diagnosis, and industrial processing. The quantum cascade laser produces a lasing light beam in mid-infrared wavelengths (for example, a wavelength range of 3 to 30 micrometers). Quantum cascade lasers can be light sources that offer a reduction in size and cost, and are now being developed. Particularly, in the field of gas sensing, which is promising in the mid-infrared wavelengths, single-mode DFB quantum cascade lasers in the mid-infrared region become the mainstream of the development because they can provide light for use in detecting an absorption line of a specific gas. Such a quantum cascade laser incorporates, in principle, non-radiative recombination centers due to LO phonon scattering, which increase the threshold current of the lasing to several hundred of mA to several amperes, so that the quantum cascade laser consumes a large amount of power. The increase in the threshold current is one of the reasons to hinder the practical application of the quantum cascade laser. In order to suppress the increase in the threshold current, the quantum cascade laser can be provided with the lasing cavity having a metal film on the end face thereof.

Figure 9:
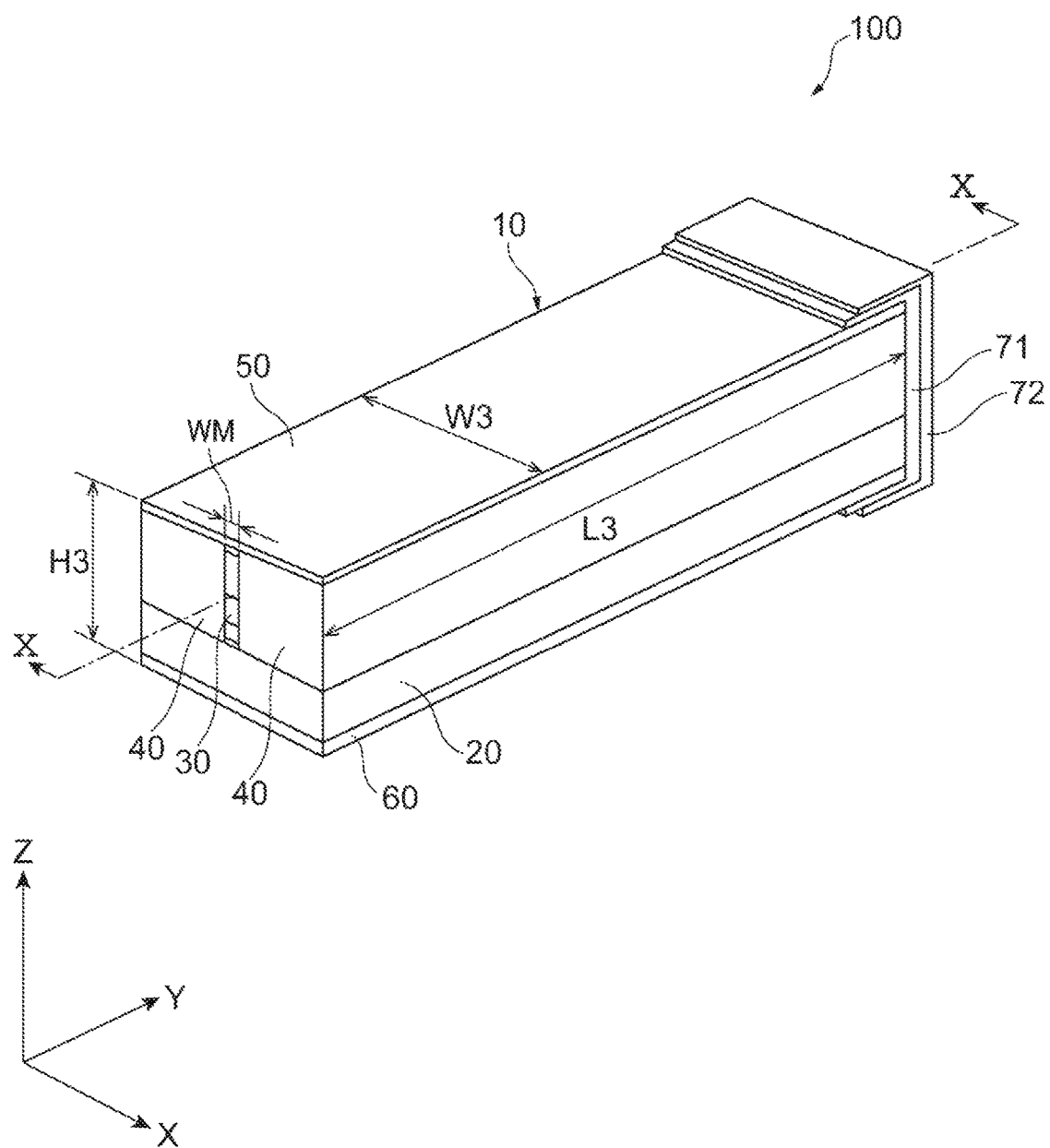
FIG. 9 is a perspective view showing another quantum cascade semiconductor laser.
Figure 10:
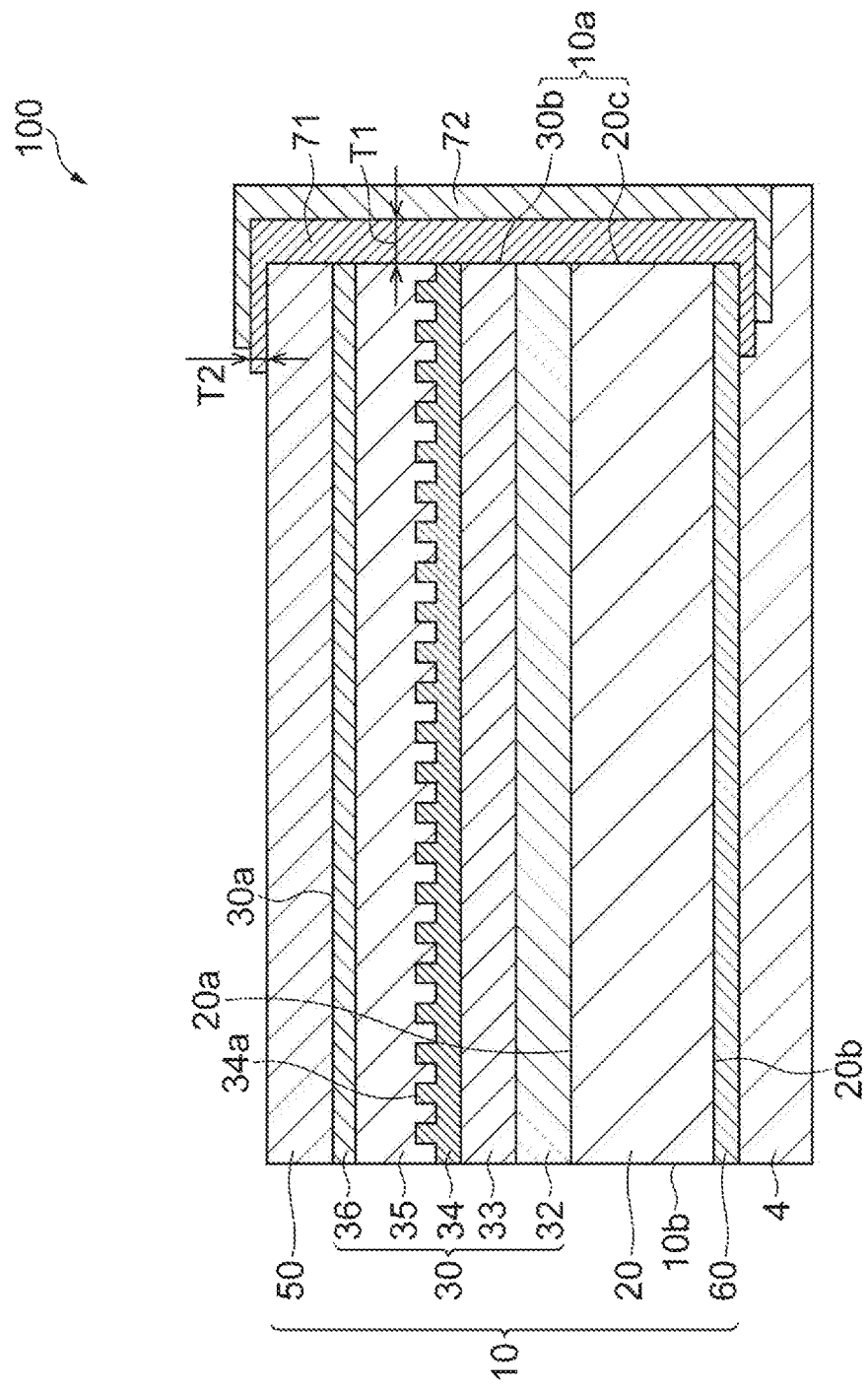
FIG. 10 is a cross-sectional view taken along line X-X shown in FIG. 9.

A description will be given of the structure of a quantum cascade laser having a metal film on the end face thereof. FIG. 9 is a perspective view showing the quantum cascade laser 100. FIG. 10 is a cross-sectional view taken along line X-X shown in FIG. 9. For easy understanding, an XYZ coordinate system is depicted in each figure, and in the present embodiment, X-, Y-, and Z-directions are orthogonal to each other. Please note that, in order to show a conductive path through the solder material, FIG. 10 shows not only the quantum cascade laser 100 but also the solder material 4, which is used in mounting the quantum cascade laser 100 on a submount. The quantum cascade laser 100 has a buried-heterostructure similar to that of the quantum cascade laser 1 of the present embodiment. As shown in FIG. 9, the quantum cascade laser 100 includes a semiconductor device portion 10, an insulating film 71, and a metal film 72.

The difference between the quantum cascade laser 100 and the quantum cascade laser 1 according to the present embodiment is that the quantum cascade laser 100 does not have the insulating film 75. Mounting the quantum cascade laser 100 on the submount with the solder material 4 causes the metal film 72 on the lower electrode 60 to make contact with the solder material 4. The application of an external voltage (for example, a high voltage of 10 volts or more) for laser oscillation between the upper and lower electrodes 50 and 60 in the quantum cascade laser 100 results in the application of the voltage thus applied on the lower electrode 60 to the metal film 72 via the solder material 4, which makes contact with the metal film 72. The external voltage, consequently, is applied to the insulating film 71 between the upper electrode 50 and the metal film 72 on the upper electrode 50.

As described above, the thickness T2 of the insulating film 71 on the upper electrode 50, however, is extremely thinner than the thickness T1 of the insulating film 71 on the rear end face 10a. The above high voltage of, for example, 10 volts or more may be applied to the insulating film 71, disposed between the upper electrode 50 and the metal film 71, to cause breakdown of the insulating film 71. This breakdown may form a current path in the insulating film 71, which allows a large amount of current (that is, inrush current) to flow in the vicinity of the rear end face 10a therethrough, so that the quantum cascade laser 100 may be subject to failure, such as breakage at an end face. Making an insulating film on the upper electrode 50 thick provides the resultant insulating film on the rear end face 10a with a large thickness (for example, several times thicker than before). Forming this thick film increases deposition time to form the insulating film 71 on the rear face 10a (for example, several times longer), thereby reducing the productivity of the quantum cascade laser 100. An insulating film with such a large thickness makes stress to the rear end face 10a large, and this stress may cause deterioration of the rear end face 10a, such as cracking of the insulating film 71, peeling-off of the insulating film 71 from the rear end face 10a.

In contrast, as shown in FIG. 3, the quantum cascade laser 1 according to the present embodiment is provided with the insulating film 75 on the lower electrode 60 and the metal film 72 that covers the rear end face 10a. Covering the metal film 72 on the lower electrode 60 with the insulating film 75 allows the insulating film 75 to be between the metal film 72 and the solder material 4. The insulating film 75 thus disposed can prevent the metal film 72 from making contact with the solder material 4, allowing electrical insulation of the metal film 72, the lower electrode 60 and the solder material 4 from each other. In the above-described quantum cascade laser 1, the electrical insulation can prevent the application of the external voltage to the insulating film 71 disposed between the upper electrode 50 and the metal film 72 on the upper electrode 50, and no application of the voltage to the insulating film 71 avoids the breakdown of the insulating film 71. No breakage of the insulating film 71 leads to no destruction of the end face, thereby suppressing degradation of the device performances of the quantum cascade laser 1. All or a partial coating of the laminate end face 30b acting as the laser cavity of the quantum cascade laser 1 allows the metal film 72 to reflect guided light. The metal film 72 enabling the high reflection can improve the device performances of the quantum cascade laser 1 (in particular, the threshold current can be reduced).

In addition, as in the present embodiment, the insulating film 71 may include at least one of $SiO_2$, SiON, SiN, alumina, BCB resin, and polyimide resin, each of which have excellent durability and insulating properties for use in a protective film for the rear end face 10a. Further, these dielectric films can be formed by a familiar method, such as sputtering, CVD, or spin coating, which allows easy formation on the rear face 10a. Using one of these methods can introduce the deposition of the insulating film 71 into the fabricating process of the quantum cascade laser 1 easily.

In the present embodiment, the metal film 72 may include gold (Au). Gold can provide the metal film 72 on the rear facet 10a with a high reflectivity of, for example, more than 90 percent.

In the present embodiment, the upper cladding layer 35 may include an InP layer. InP is transparent (no absorption of light) to lasing light in the mid-infrared wavelengths, and can be excellent for material of the upper cladding layer 35. InP is a binary mixed crystal lattice-matched to the semiconductor substrate 20 of InP, so that an InP layer can be satisfactorily grown on the InP base. Further, InP has an excellent thermal conductivity, and can dissipate heat from the core layer 33 through the upper cladding layer 35 satisfactorily. This excellent thermal conductivity can provide the quantum cascade laser 1 with excellent temperature characteristics.

In the present embodiment, the core layer 33 includes multiple active layers enabling light emission, and multiple injection layers enabling injection of carriers into the adjacent active layer, and the active layers and the injection layers are arranged in the Z direction. Providing the injection layer between the active layers as above allows electrons thus optically-transitioned in the upstream active layer to continuously and smoothly move to the downstream active layer, and the transition of electrons can generate light emission between the subbands in the conduction band in the active layer. The core layer 33 can provide the quantum cascade laser 1 with excellent lasing characteristics.

In the present embodiment, the active layers and the injection layers each may include an array of GaInAs/AlInAs superlattices. The superlattice of each active layer can provide transitions between subbands of electron in the conduction band in the active layer, and the subband transition allows optical emission of mid-infrared wavelength (e.g., 3 to 20 micrometers). The quantum cascade laser 1 provides the core layer 33 with material allowing lasing of a wavelength in the mid-infrared region.

In the present embodiment, the semiconductor substrate 20 may be an InP base. The semiconductor laminate 30 of the quantum cascade laser 1 has a lattice constant close to that of InP. Using the InP base for the semiconductor substrate 20 allows the growth of the semiconductor laminate 30 on the semiconductor substrate 20 with an excellent crystal quality. InP is transparent to light in the mid-infrared wavelengths, so that the InP substrate can work as a lower cladding layer for the core layer 33.

(First Modification)

Figure 11:
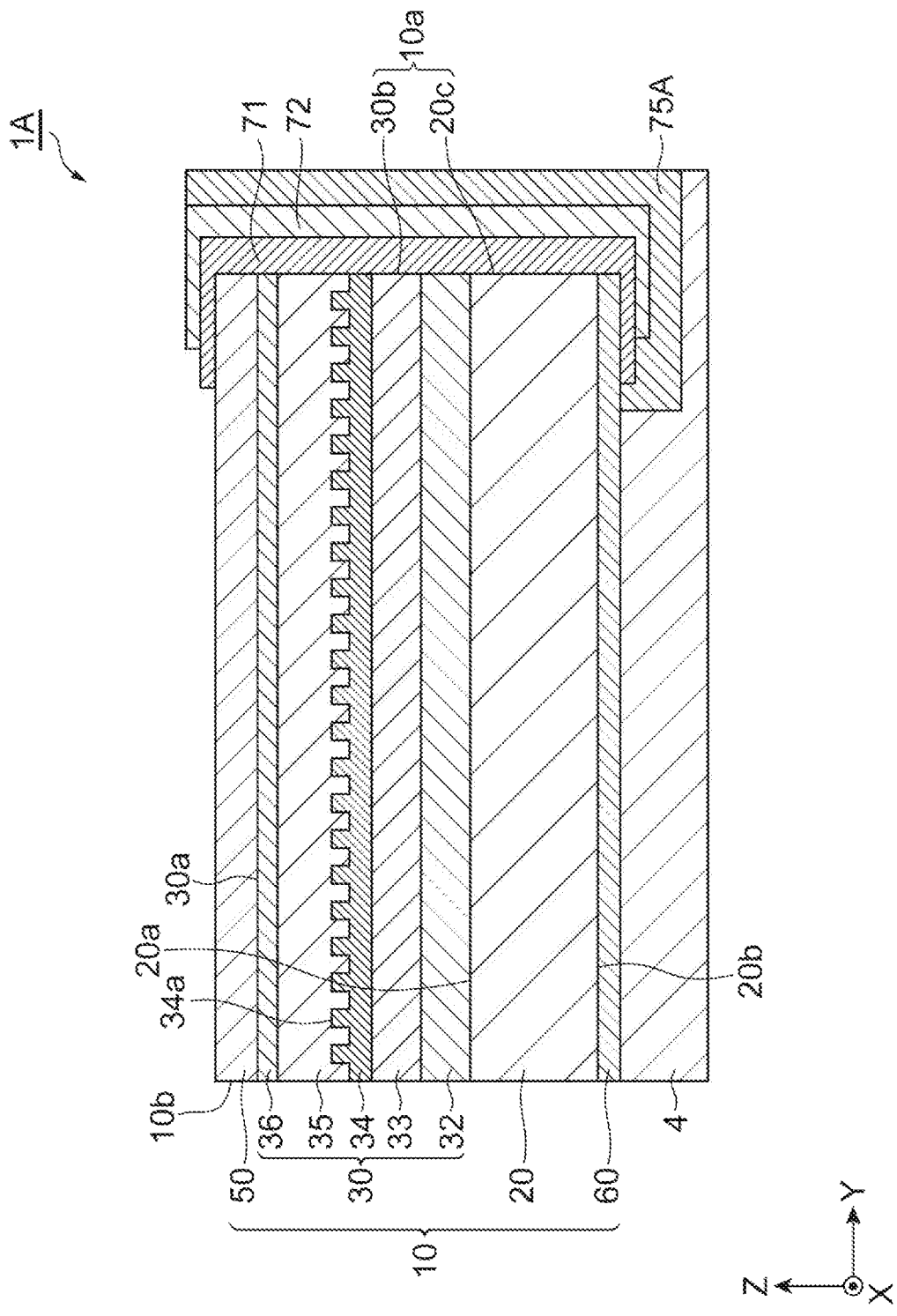
FIG. 11 is a cross-sectional view showing a quantum cascade semiconductor laser according to the embodiment.
Figure 12:
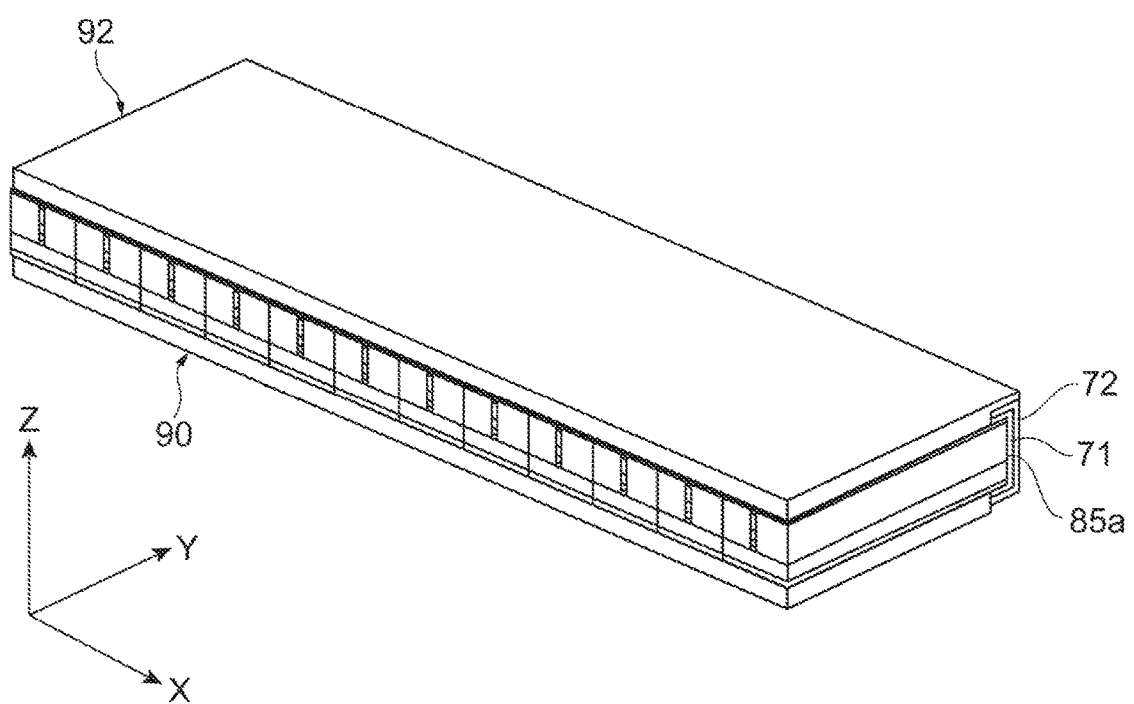
FIG. 12 is a schematic view showing a major process in a method for fabricating a quantum cascade semiconductor laser shown in FIG. 11.

FIG. 11 is a perspective view showing the quantum cascade laser 1A according to the first modification of the embodiment. FIG. 12 is a cross-sectional view, taken along line XII-XII shown in FIG. 11 and a plane parallel to the YZ-plane in the present embodiment. The quantum cascade laser 1A is actually mounted on the submount 3 with the solder material 4 in the above-described embodiment. FIG. 12 shows that the solder material 4 adheres to the bottom face of the quantum cascade laser 1A. The present modification is different in the range of an insulating film from the above embodiment. The insulating film 75A of the present modified embodiment extends from the substrate end face 20c to the laminate end face 30b, in addition to the range of the insulating film 75. Specifically, all of the substrate end face 20c and the laminate end face 30b are covered with the insulating film 75A in addition to the insulating and metal films 71 and 72 that are disposed between the rear end face 10a and the insulating film 75A. The insulating film 75A has a thickness of, for example, 100 to 300 nm in the Y direction on the laminate end face 30b. Disposing the insulating film 75A on the substrate end face 20c and the laminate end face 30b can enhance the mechanical strength of the insulating and metal films 71 and 72. The insulating film 75A in the present embodiment allows the metal film 72 to work as a high reflectance film in the quantum cascade laser 1B.

A description will be given of exemplary processes in a method of fabricating a quantum cascade laser 1A. The present method has a former part, which has the same process steps as those in the above embodiment and ends at the process of forming the metal film 72 on the chip bar 85 (as shown in FIG. 7A), and a next part, which begins with the step that follows the step of forming the insulating film 75A on the end face 85a. In the following description, the next part will be described below in detail. FIG. 12 is a view showing a process step for the quantum cascade laser 1A of FIG. 11. First, a protector 92 is prepared. The protector 92 is a thin plate of a rectangle with a length in the Y direction longer than that of the protector 90, and the protector 92 with the above length can cover the entire upper electrode 60. As shown in FIG. 12, the lower electrode 60 is covered with the protector 90, and the entire upper electrode 50 is covered with the protector 90. The protector 92 covers the insulating and metal films 71 and 72 on the upper electrode 50.

Next, the insulating film 75A is formed on the end face 85a. Specifically, flux containing constituent atoms for the insulating film 75A is supplied toward the end face 85a, and the constituent atoms are deposited on the end face 85a. The insulating film 75A is formed over the end face 85a, and the constituent atoms that miss the end face 85a fly along the lower electrode 60, and the protector 92 covering the upper electrode 50 prevents the formation of the insulating film 75A on the upper electrode 50. The deposition process with the protectors 90 and 92 provides the end face 85a with the insulating film 75A. The present method for fabricating the quantum cascade laser 1A has the latter part, which is the same as those of the above embodiment.

Figure 13:
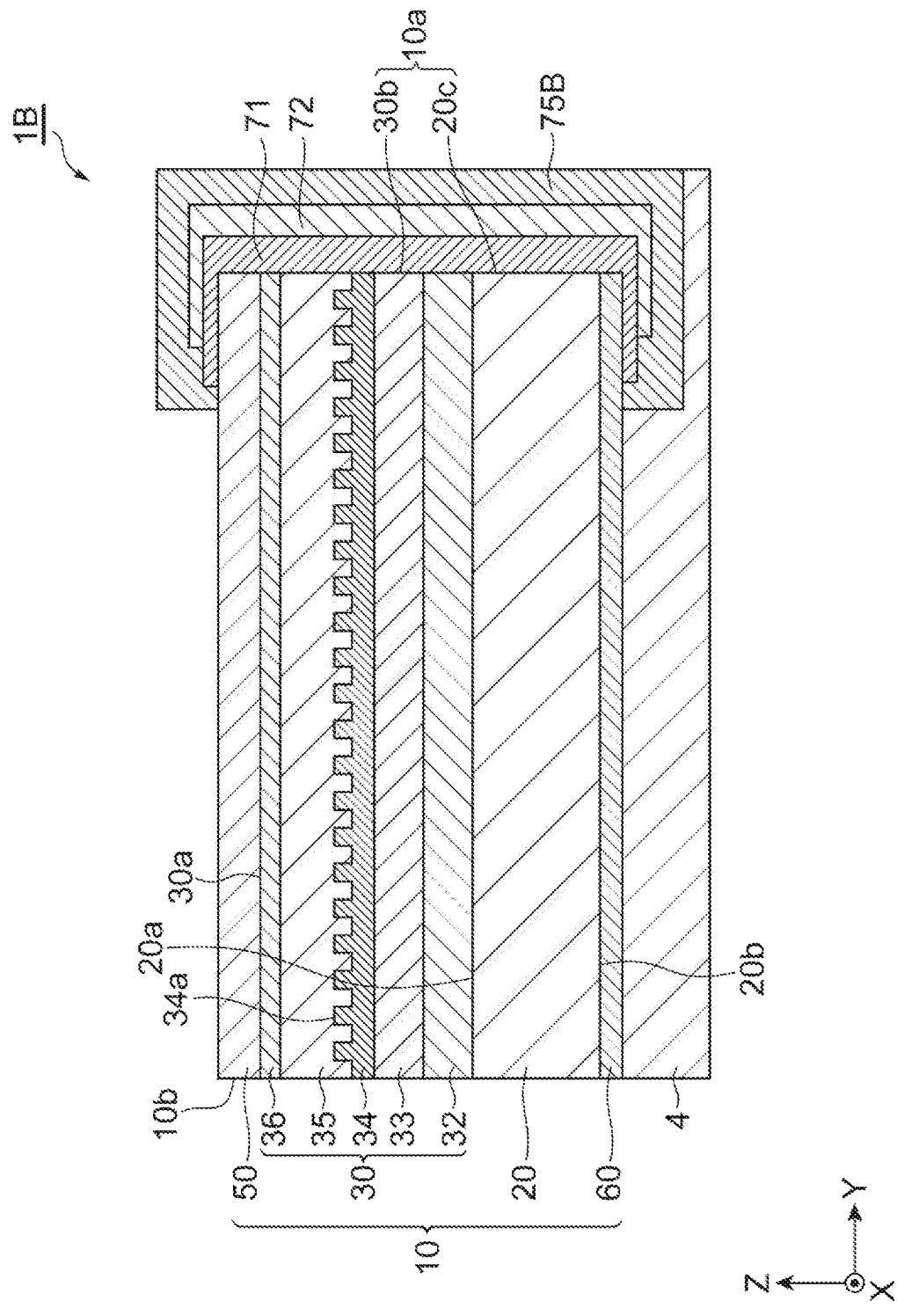
FIG. 13 is a schematic cross-sectional view showing a major process in the method according to a first modified embodiment.

FIG. 13 is a perspective view showing the quantum cascade laser 1B according to the first modified embodiment. FIG. 13 is a cross-sectional view, taken along a plane parallel to the YZ-plane, showing the semiconductor laminate 30. The quantum cascade laser 1B is actually mounted on the submount 3 with the solder material 4 in the above-described embodiment. FIG. 13 shows that the solder material 4 adheres to the bottom face of the quantum cascade laser 1A without the submount 3 shown. As shown in FIG. 13, the insulating film 75B extends on the laminate end face 30 and the upper electrode 50 in addition to the coating of the insulating film 75. The insulating film 75B covers ends of the insulating and metal films 71 and 72 on the upper electrode 50, and has an end farther than the ends of the insulating and metal films 71 and 72 with respect to the rear end face 10b in the Y direction.

As seen from the above, disposing the insulating film 75A on the laminate end face 30b and the upper electrode 50 provides the quantum cascade laser 1B with the above advantageous effects. The quantum cascade laser 1B according to the present modified embodiment can enhance the mechanical strength of the insulating and metal films 71 and 72. A description will be given of a method for fabricating a quantum cascade laser 1B. This method has a former part, which has the same process steps as those in the first embodiment method and ends at the process of forming the metal film 72 on the end face 85a, and a latter part, which begins with the step that follows the step of preparing other protectors each of which has a length shorter that of the protector 90, and the other protectors is used to cover the upper and lower electrodes 50 and 60. The upper and lower electrodes 50 and 60 are covered with the other protectors. After attaching the other protectors, the insulating film 75B is formed with the other protectors. Constituent atoms for the insulating film 75B are deposited on the end face 10a, and the constituent atoms that miss the end face 85a fly along the upper and lower electrodes 50 and 60 to form deposited materials on the upper and lower electrodes 50 and 60. The above process brings the insulating film 75B to completion.

(Second Modification)

Figure 14:
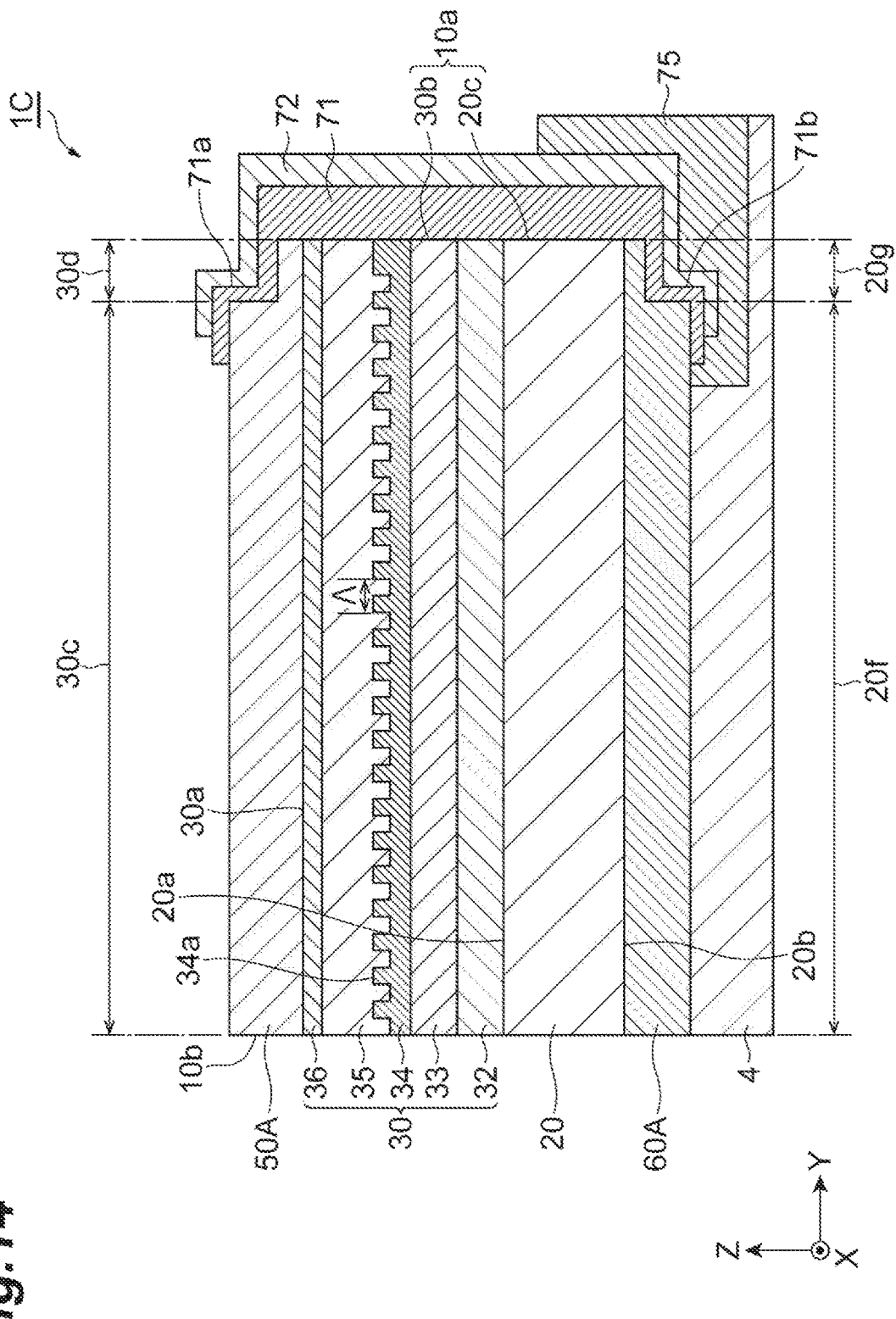
FIG. 14 is a perspective view showing a quantum cascade semiconductor laser according to a second modified embodiment.

FIG. 14 is a cross-sectional view showing a quantum cascade laser 1C according to the second modification of the above embodiment. In FIG. 14, the cross-section is taken along a plane parallel to the YZ plane and shows the semiconductor laminate 30 of the quantum cascade laser 1C. This modified example is different from the above embodiment in thicknesses of the upper electrode and the lower electrode. Specifically, the upper and lower electrodes 50A and 60A each have one portion with a small thickness and another portion with a large thickness. As shown in FIG. 14, the upper surface 30a of the semiconductor laminate 30 has a first area 30c and a second area 30d, which is between the laminate end face 30b and the first area 30c in the Y direction. The first and second areas 30c and 30d are arranged in the direction of an axis extending in the Y direction. The first area 30c is different from the second area 30d, and is contiguous to the front end face 10b. The second area 30d is disposed close to one edge of the upper surface 30a in the direction of an axis extending in the Y direction, and the second area 30d is contiguous to the rear end face 10a. The upper electrode 50A is disposed on both the first and second areas 30c and 30d. The upper electrode 50A has one portion on the first area 30c and another portion on the second area 30d, and in the upper electrode 50A, the other portion on the second area 30d has a thickness smaller than that of the one portion on the first area 30c.

Further, the back surface 20b includes a first area 20f and a second area 20g, which is between the substrate end face 20c and the first area 20f along an axis of the Y direction. The first and second areas 20f and 20g are arranged along the axis of the Y direction. In the back surface 20b, the first area 20f is different from the second area 20g, and is contiguous to the front end face 10b. The second area 20g is disposed at one end of the back surface 20b, and is contiguous to the rear end face 10a. The lower electrode 60A is disposed on the first and second areas 20f and 20g. The lower electrode 60A has one portion on the first area 20f and another portion on the second area 20g, and the other portion on the second area 20g has a thickness smaller than that of the one portion on the first area 20f.

In order to avoid deterioration of heat dissipation in the quantum cascade laser 1C, the upper and lower electrodes 50A and 60A have respective thicknesses, each of which is in the range of 5 to 10 micrometers in the Z direction, in the one portions thereof on the first area 30c and the first area 20f. In contrast, the upper and lower electrodes 50A and 60A have respective thicknesses, each of which is in the range of 0.5 to 1 micrometers in the Z direction, in the other portions on the second area 30d and the second area 20g. The upper and lower electrodes 50A and 60A have respective lengths, each of which is in the range of 10 to 100 micrometers in the Y direction, in the other portions on the second areas 30d and 20g.

The insulating films 71, 72 and 75 extend from the second area 20g to the first area 20f. The insulating films 71 and 72 extend from the first area 30c to the second area 30d. The insulating film 71 is conformal with the lower electrode 60A. The insulating film 71 has a stepped portion 71a (difference in level) at the boundary between the one portion of the upper electrode 50A on the second area 30d and the other portion of the upper electrode 50A on the first area 30c. The insulating film 71 is also conformal with the upper electrode 50A, and has a stepped portion 71b (difference in level) at the boundary between the one portion of the upper electrode 50A on the first area 20f and the other portion of the upper electrode 50A on the second area 20g. In one example, the stepped portions 71a and 71b each extend in the direction orthogonal to the Y direction.

Metal films for the upper and lower electrodes 50A and 60A have respective thin portions around cleavage lines, and providing at least one of the upper and lower electrodes 50A and 60A with the thin portion(s) make it easy to conduct cleavage for forming chip bars, each of which has the partly-thinned upper and lower electrodes 50A and 60A in the vicinity of the rear end face 10a (specifically, the laminate end face 30b and the substrate end face 20c), allowing yield enhancement in the method for fabricating the quantum cascade laser 1C. The thickness of the one portion, which is on the second area 30d, of the upper electrode 50A is smaller than that of the other portion, which is on the first area 30c, of the upper electrode 50A, so that the one portion of the upper electrode 50A has a sheet electrical resistance larger than that of the other portion of the upper electrode 50A. Further, the thickness of the one portion, which is on the second area 20g, of the lower electrode 60A is smaller than that of the other portion, which is on the first area 20f, of the lower electrode 60A, so that the one portion of the lower electrode 60A has a sheet electrical resistance larger than that of the other portion of the lower electrode 60A. These large sheet-resistance portions of the upper and lower electrodes 50A and 60A make it possible to reduce the leakage current flowing in the vicinity of the rear end face 10a. The reduced leakage current can provide the quantum cascade laser 1C with improved device performances (for example, the threshold current can be reduced). The quantum cascade laser 1C, which has thin portions of the upper and lower electrodes 50A and 60A on the area 20g and the region 30d, also has the same advantageous effects as those of the above embodiment.

Figure 15A:
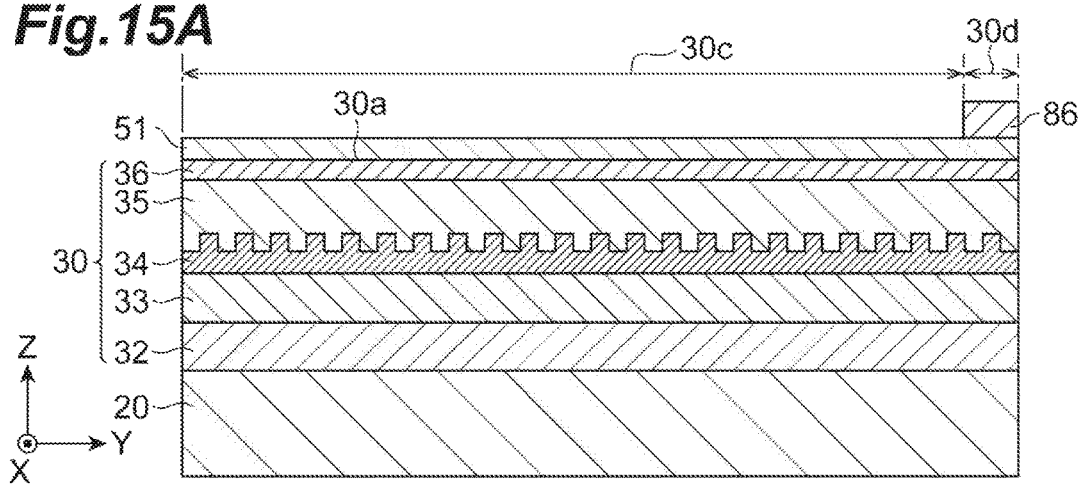
FIG. 15A is a schematic view showing a major process in a method for fabricating a quantum cascade semiconductor laser shown in FIG. 14.
Figure 15B:
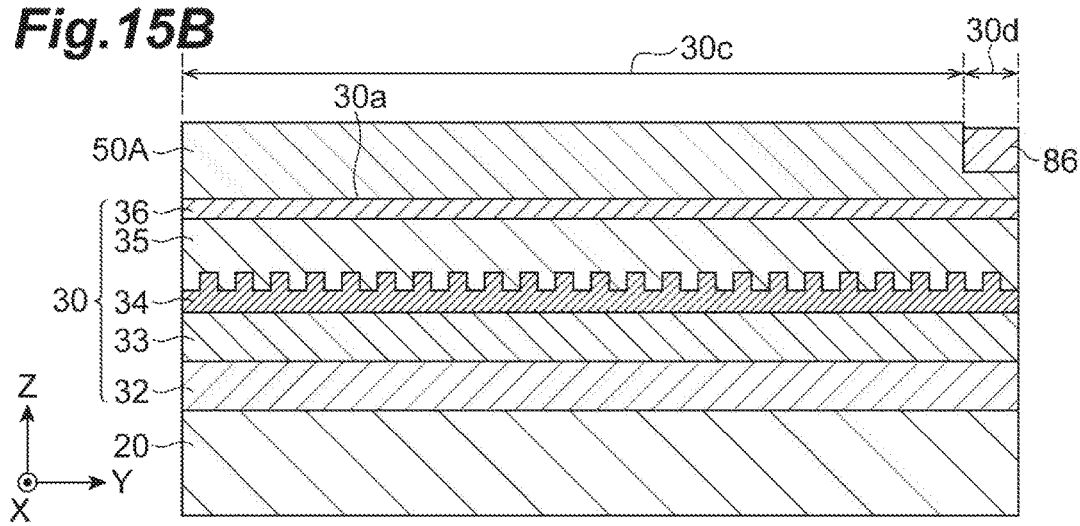
FIG. 15B is a schematic view showing a major process in the method for fabricating the quantum cascade semiconductor laser shown in FIG. 14.
Figure 15C:
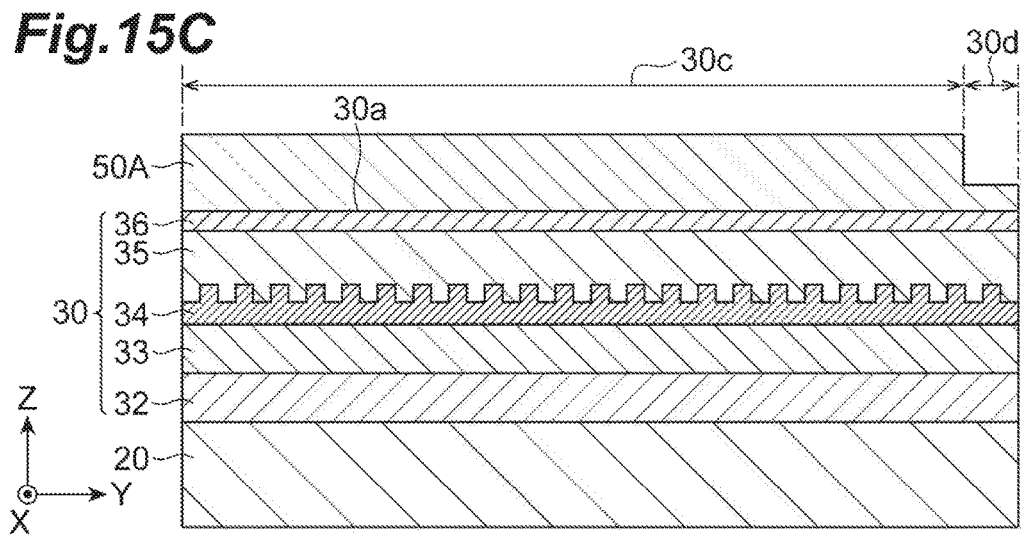
FIG. 15C is a schematic view showing a major process in the method for fabricating the quantum cascade semiconductor laser shown in FIG. 14.

Subsequently, a description will be given of a method for fabricating the quantum cascade laser 1C according to the present modification. The method for fabricating the quantum cascade laser 1C according to this modification has a former part, which has the same process steps as those in the first embodiment method and ends at the third crystal growth step (as shown in FIG. 5C) of forming the two current block portions 40, and a latter part, which begins with the process of forming the upper electrode 50A on the semiconductor laminate 30. In the following description, the latter part will be described in detail. FIGS. 15A to 15C are views each showing a process of fabricating the quantum cascade laser 1C shown in FIG. 14. FIGS. 15A to 15C are cross sectional views, each taken along a plane equivalent to the YZ plane, showing the semiconductor laminate 30 of the quantum cascade laser 1C. As shown in FIG. 15A, a thin metal film 51 for the upper electrode 50A is formed on the entire upper surface 30a of the semiconductor laminate layer 30. Thereafter, resist is applied to the metal film 51, and then is pattered to form a resist mask 86, which has a pattern covering the second area 30d.

As shown in FIG. 15B, a metal film 51 is further formed on the thin metal film 51 with the resist mask 86. In this deposition, the metal film 51 is not formed on the resist mask 86, and deposited on the metal film 51 on the first area 30c in the opening of the resist mask. The resulting metal film 51 on the second area 30d has a thickness smaller than that of the metal film 51 on the first area 30c. As shown in FIG. 15C, the resist mask 86 is removed to obtain the upper electrode 50A on the upper surface 30a. Subsequently, the lower electrode 60A is formed on the back surface 20b of the semiconductor substrate 20 in the same manner as that of forming the upper electrode 50A. The subsequent steps are the same as those in the above embodiment.

Specifically, flux of metal particles for the metal film 72 is supplied toward the end face 85a to form the metal film 72, and is bounced back by the stepped portion 71a, thereby hindering the flux to fly along the upper electrode 50A. This stepped portion makes it difficult for the metal film 72 to be formed on the upper electrode 50A on the first area 30c, ensuring electrical insulation between the metal film 72 and the upper electrode 50A. The stepped portion 71b forces the metal particles for the metal film 72 to recoil, and this recoil hinders the metal particles from reaching the lower electrode 60 on the second area 20f, ensuring electrical isolation between the metal film 72 and the lower electrode 60. The quantum cascade laser 1C according to the present modification can enhance the insulation in the vicinity of the rear end face 10a, and reduce the occurrence of breakdown of the insulating film 71 in the vicinity of the rear end face 10a.

This modified example shows that both the upper electrode 50A on the second area 30d and the lower electrode 60A on the second area 20g can be partly thinned and that alternatively one of the upper and lower electrodes 50A and 60A can be partly thinned. Specifically, the upper electrode 50A may be partly thinned on the second area 30d or the lower electrode 60A may be partly thinned on the second area 20g. These three kinds of the quantum cascade lasers 1C each have the same advantageous effects as those of the embodiment.

Figure 16:
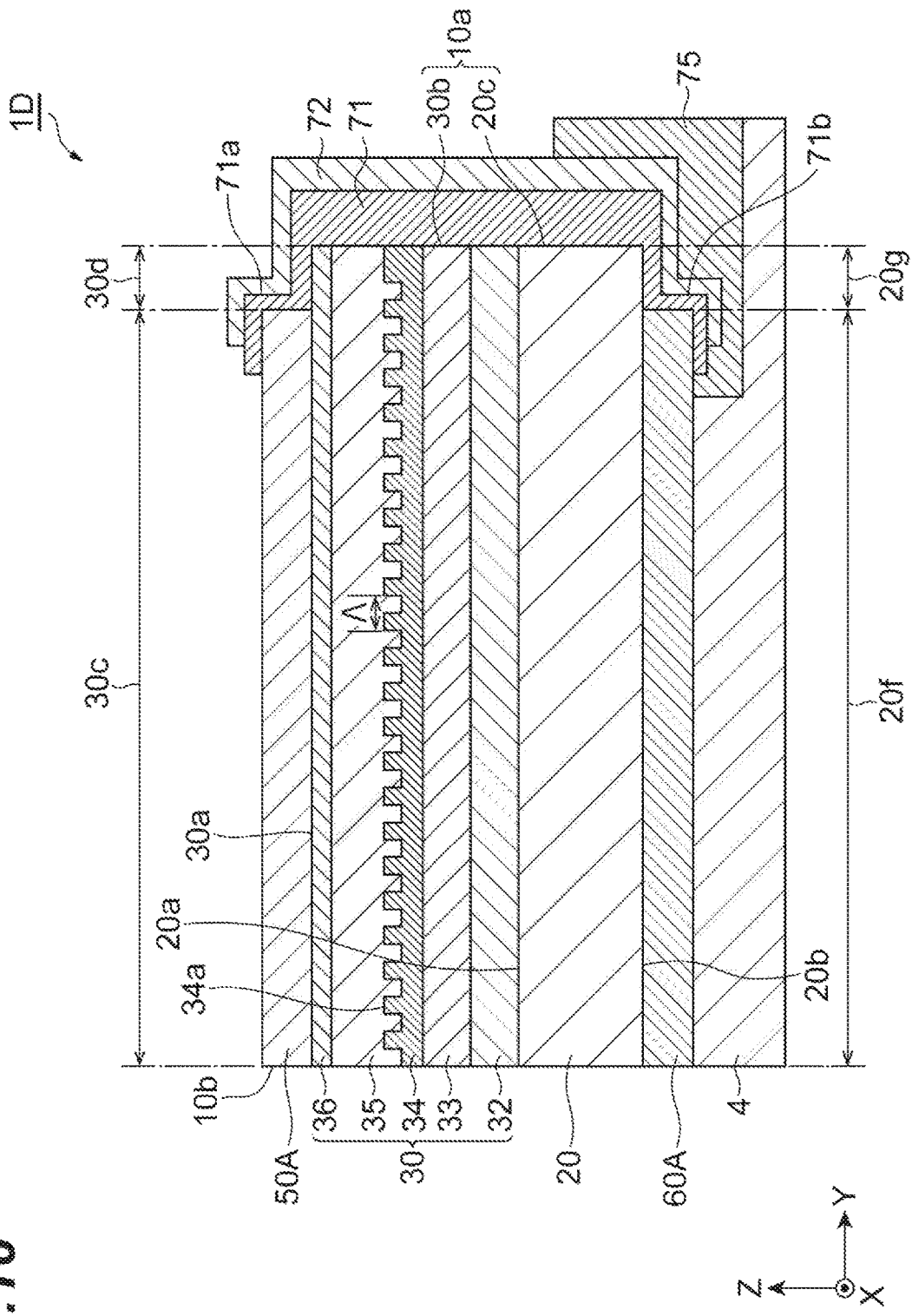
FIG. 16 is a perspective view showing a quantum cascade semiconductor laser according to still another embodiment.

FIG. 16 is a cross-sectional view showing a quantum cascade laser 1D according to the present modification. As shown in FIG. 16, the upper electrode 50A is disposed on the first area 30c and is not disposed on the second area 30d, and the lower electrode 60A may be disposed on the first area 20f and not be disposed on the second area 20g. The insulating films 71, 75 and 72 each extend from the second area 20g to the first area 20f. The insulating films 71 and 72 each extend from the second area 30d to the first area 30c.

The partial removal of the upper and lower electrodes 50A and 60A in the vicinity of the rear end face 10a allows the quantum cascade laser 1D to have the above-described advantageous effects. Specifically, separating metal films for the upper and lower electrodes 50A and 60A apart from lines to be cleaved, or the rear end face, make it easy to form the rear face 10a by cleavage, thereby increasing in yield in fabricating the quantum cascade laser 1D. Spacing the upper and lower electrodes 50A and 60A apart from the rear end face 10a makes the electric resistance in the vicinity of the rear end face 10a large, thereby reducing the leakage current flowing in the vicinity of the rear end face 10a. The quantum cascade laser 1D is provided with improved device characteristics (in particular, the reduction in the threshold current).

Figure 17A:
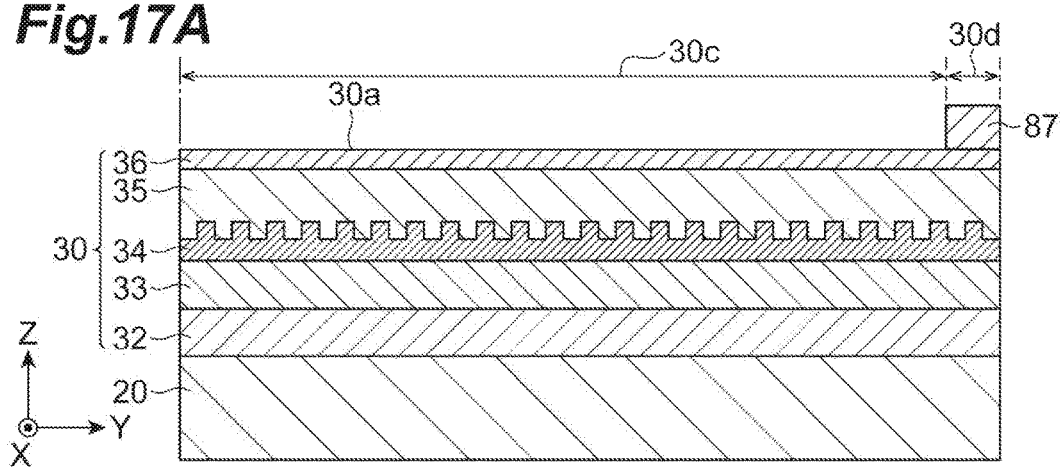
FIG. 17A is a schematic view showing a major process in a method for fabricating a quantum cascade semiconductor laser shown in FIG. 16.
Figure 17B:
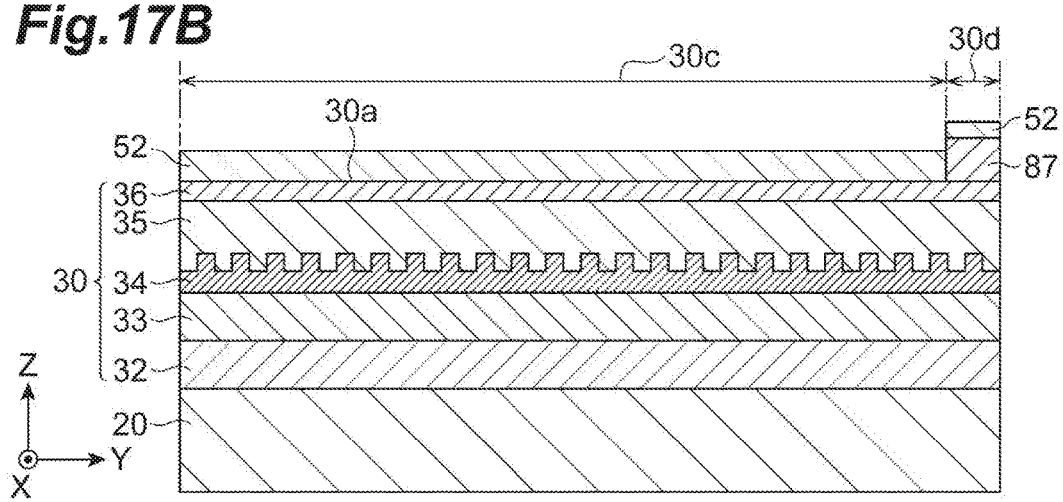
FIG. 17B is a schematic view showing a major process in the method for fabricating the quantum cascade semiconductor laser shown in FIG. 16.
Figure 17C:
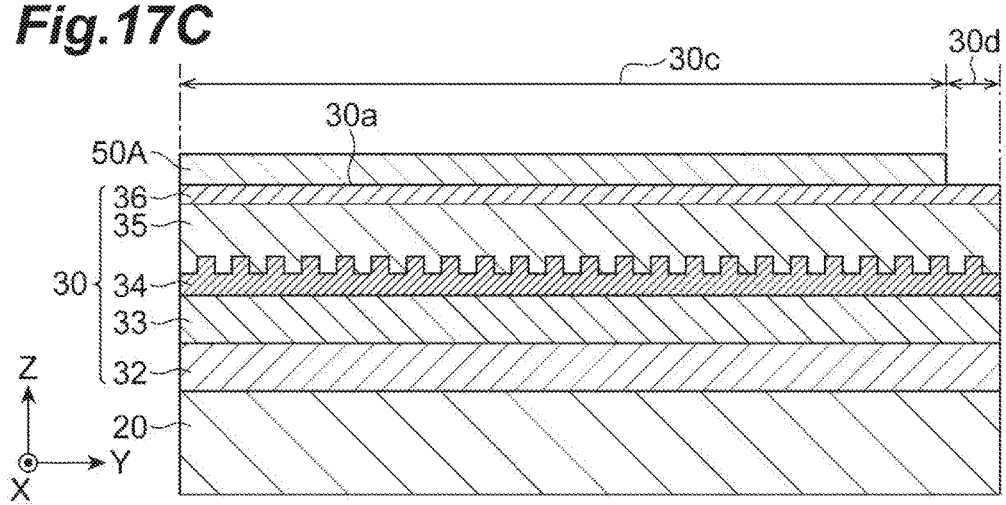
FIG. 17C is a schematic view showing a major process in the method for fabricating the quantum cascade semiconductor laser shown in FIG. 16.

In fabricating the quantum cascade laser 1D, after the third crystal growth step (shown in FIG. 5C) of forming the two current block portions 40 according to the above embodiment, the following process can be carried out. FIGS. 17A to 17C are schematic views each showing a process of fabricating the quantum cascade laser 1D shown in FIG. 16. FIGS. 17A to 17C are cross sections, each of which is taken along a plane parallel to the YZ plane, showing the semiconductor laminate 30 of the quantum cascade laser 1D. As shown in FIG. 17A, resist is patterned to form a resist mask 87 with a pattern, which covers the second area 30d. Next, as shown in FIG. 17B, a metal film 52 for the upper electrode 50A is formed on the first area 30c and the resist mask 87, for example, by vapor deposition. As shown in FIG. 17C, the deposition process of the metal film 52 is followed by lifting-off which simultaneously removes the resist mask 87 and the deposited material of the metal film 52 thereon, thereby forming the upper electrode 50A on the back surface 20b.

Subsequently, the lower electrode 60A is formed on the back surface 20b of the semiconductor substrate 20 in the same manner as the process for forming the upper electrode 50A. The subsequent process steps are the same as those in the above embodiment. These processes bring a substrate product for the quantum cascade laser 1D to completion. The substrate product will be subject to processes that are the same as those of the above embodiment. In the quantum cascade laser 1D, the upper and lower electrodes 50A and 60A are disposed on the first areas 30c and 20f, respectively. If needed, the upper electrode 50A is disposed on the first area 30c and not disposed on the second area 30d, and the lower electrode 60A is disposed on the entire back surface and not disposed on the second area 30d, and alternatively, the lower electrode 60A is disposed on the first area 20f and the upper electrode 50A is disposed on the entire upper surface 30a. These quantum cascade lasers each have the same advantageous effects as the embodiment.

(Third Modification)

FIG. 18 is a cross-sectional view showing a quantum cascade laser 1E according to the third modification of the above embodiment. In FIG. 18, the cross-section is taken along a plane parallel to the YZ plane and shows the semiconductor laminate 30 of the quantum cascade laser 1E. This modified example is different from the above embodiment in the range of the metal film. Specifically, the metal film 72A according to the third modification, as shown in FIG. 18, is not disposed on the lower electrode 60, and is disposed on the upper electrode 50 and the rear end face 10a. This metal film 72A is not disposed on the lower electrode 60, and accordingly can reliably isolate the metal film 72A from the lower electrode 60, thereby preventing the application of an external voltage enabling the lasing to the insulating film 71 between the upper electrode 50 and the metal film 72A on the upper electrode 50. This results in the reduction in the breakdown of the insulating film 71 due to the application of the above external voltage. This reduction can prevent the deterioration of the device performances, caused by breakage of the end face, such as the damage of the insulating film 71, of the quantum cascade laser 1E.

Subsequently, a description will be given of a method for fabricating the quantum cascade laser 1E according to the present modification. The method for fabricating the quantum cascade laser 1E according to this modification has a former part, which has the same process steps as those in the first embodiment method and ends at the step of forming the insulating film 71 on the end face 85a (as shown in FIG. 8A), and a latter part, which begins with the process of forming the metal film 72A on the end face 85a. In the following description, the latter part will be described below. First, a protector 92 is prepared which is also used in the first modified embodiment. The upper electrode is covered with the protector 92, and the entire lower electrode 60 is covered with the protector 92 instead of the protector 90. The protector 92 also covers the insulating film 71 on the lower electrode 60.

A metal film 72A is formed on the end face 85a. Specifically, electron beam evaporation is used to supply constituent atoms for the metal film 72 toward the end face 85a, thereby deposit the constituent atoms on the end face 85a. A part of the constituent atoms miss the end face 85a to fly along the upper electrode 50 to form the metal film 72 on the upper electrode 50. Covering the protector 92 with the entire lower electrode 60 prevents the formation of the metal film 72 on the lower electrode 60. The formation of the metal film 72 brings a substrate product to completion. The substrate product will be subject processes that are the same as those of the embodiment.

The above formation of the metal film 72 uses the protector 92, and may use another process to form the metal film 72 without the protector 92. The other process forms the insulating film 71 on the end face 85a, and continuously forms the metal film 72 thereon. The constituent atoms are supplied obliquely upward on the end face 85a, specifically, toward the end face 85a at a slant angle with respect to the direction normal to the end face 85a. The supply at the slant angle can prevent the constituent atoms from flying around behind the end face 85a, thereby avoiding the deposition of the constituent atoms on the lower electrode 60.

FIG. 19 is a cross-sectional view showing a quantum cascade laser 1F according to the present modification. FIG. 19 shows the cross section, taken along a plane parallel to the YZ plane, of the semiconductor laminate 30. As shown in FIG. 14, the quantum cascade laser 1F according to the present modification does not have the insulating and metal films 71A and 72A on the lower electrode 60, and have them on the rear end face 85a and the upper electrode 50. The quantum cascade laser 1F, which is not provided with the insulating film 71A on the rear end face 10a, has the same advantageous effects as the present embodiment. In the fabrication of the quantum cascade laser 1F, the formation of the chip bar 85 is followed by the process described below. The upper electrode 50 is covered with the protector 90, and the entire lower electrode 60 is covered with the protector 92. The protector 92 covers the lower edge, which is in contact with the end of the lower electrode 60 in the Y direction, of the insulating film 71, and then the insulating film 71A and the metal film 72A are continuously deposited on the rear end face 85a. These processes bring the insulating and metal films 71A and 72A to completion. The subsequent processes are the same as those of the embodiment.

(Fourth Modification)

Figure 20:
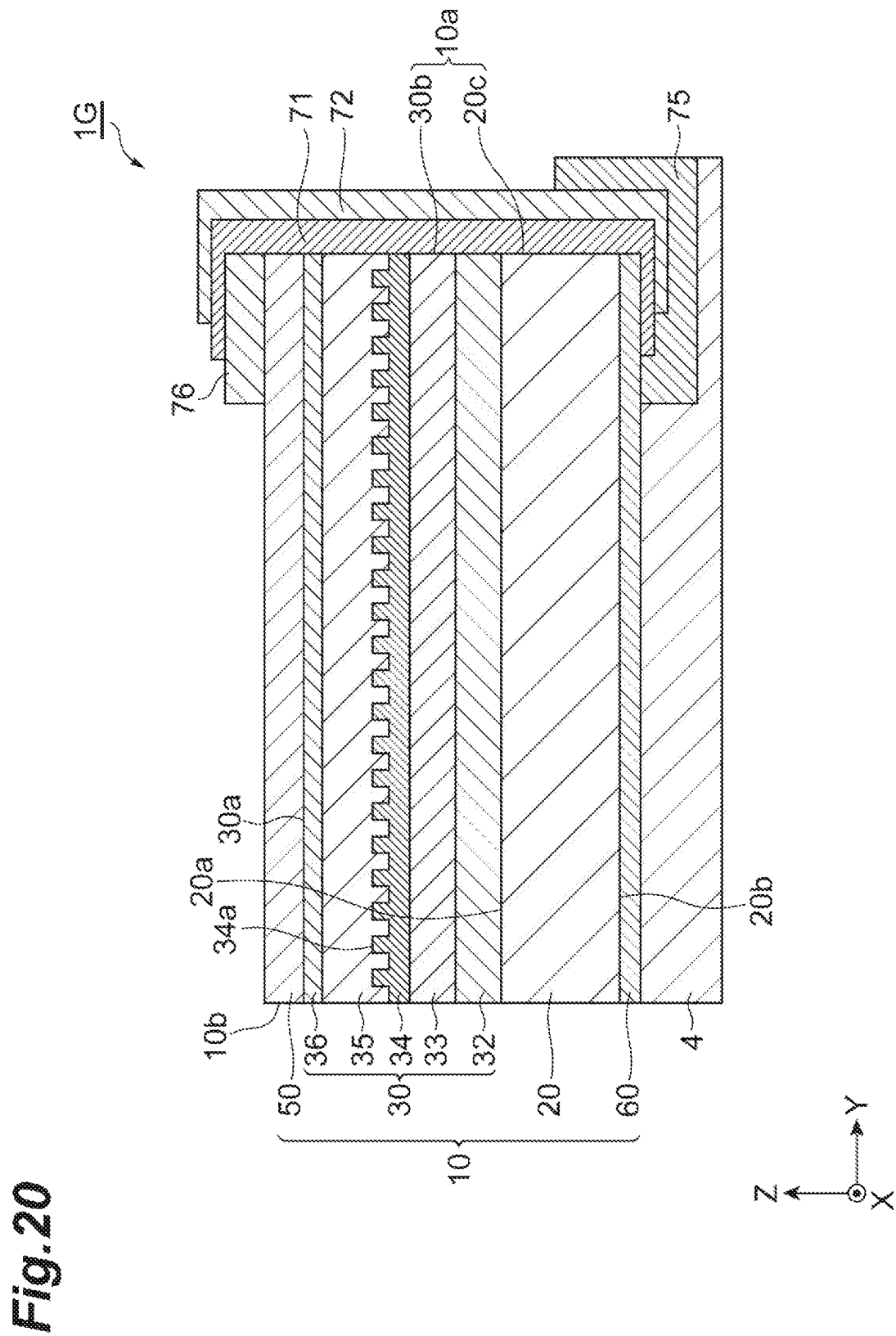
FIG. 20 is a perspective view showing a quantum cascade semiconductor laser according to a fourth modified embodiment.

FIG. 20 is a cross-sectional view showing a quantum cascade laser 1E according to the fourth modification of the above embodiment. In FIG. 20, the cross-section is taken along a plane parallel to the YZ plane and shows the semiconductor laminate 30 of the quantum cascade laser 1G. This modified example is different from the above embodiment in that the quantum cascade laser 1G further has an insulating film 76 (a third insulating film) on the upper electrode 50. The quantum cascade laser 1G is provided with the insulating film 76 between the upper electrode 50 and the insulating film 71 in the Z direction, and the insulating film 76 makes contact with both the upper electrode 50 and the insulating film 71. The insulating film 76 has one end, which is aligned with the end face 10b along a reference plane, and another end, which is apart from the end face 10b. The ends of the insulating film 71 and metal film 72 are located on the top of the insulating film 76. The insulating film 76 has a first portion and a second portion, which are arranged in the direction from the rear end face 10a to the front end face 10b. In the insulating film 76, the first portion is not covered with the insulating film 71 and the metal film 72, and the second portion is covered with the insulating film 71 and metal film 72. The end of the insulating film 71 is distant from the rear end face 10a with respect to the end of the metal film 72.

The insulating film 76 has a thickness larger than that of the insulating film 71 on the upper electrode 50 in the Z direction, and for example, has a thickness of 100 nm or more, and if possible, a 150 nm or more. The insulating film 76 is made of dielectric material, which is the same as that of the insulating film 71, and may be made of dielectric material, which is different from that of the insulating film 71. The insulating film 76 is formed of dielectric material including $SiO_2$, SiON, SiN, alumina, a BCB resin, or a polyimide resin. SiON and SiN each exhibiting an excellent adhesiveness is good for the insulating film 76.

Disposing the insulating film 76 along with the insulating film 71 between the upper electrode 50 and the metal film 72 can provide a thick insulating region (including the insulating films 71 and 76), allowing the quantum cascade laser 1G to have an excellent dielectric strength. The addition of the insulating film 76 allows the insulating films 71 and 76 to endure the external voltage (a high voltage of, for example, 10 volts) that are applied between the upper electrode 50 and the metal film 72, thereby preventing the dielectric breakdown of the insulating films 71 and 76 caused by the applied voltage. The quantum cascade laser 1G can avoid the deterioration of the device performances, which is caused by the dielectric breakdown.

Figure 21A:
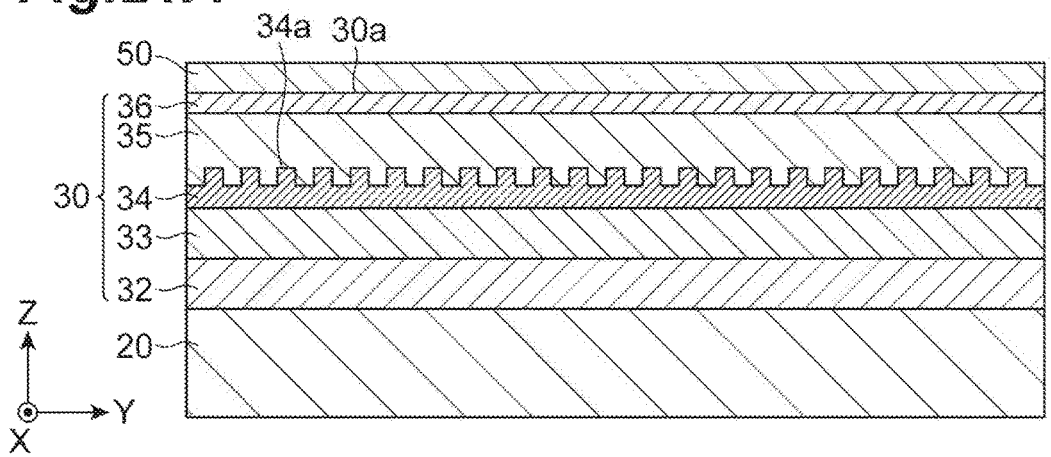
FIG. 21A is a schematic view showing a major process in a method for fabricating a quantum cascade semiconductor laser shown in FIG. 20.
Figure 21B:
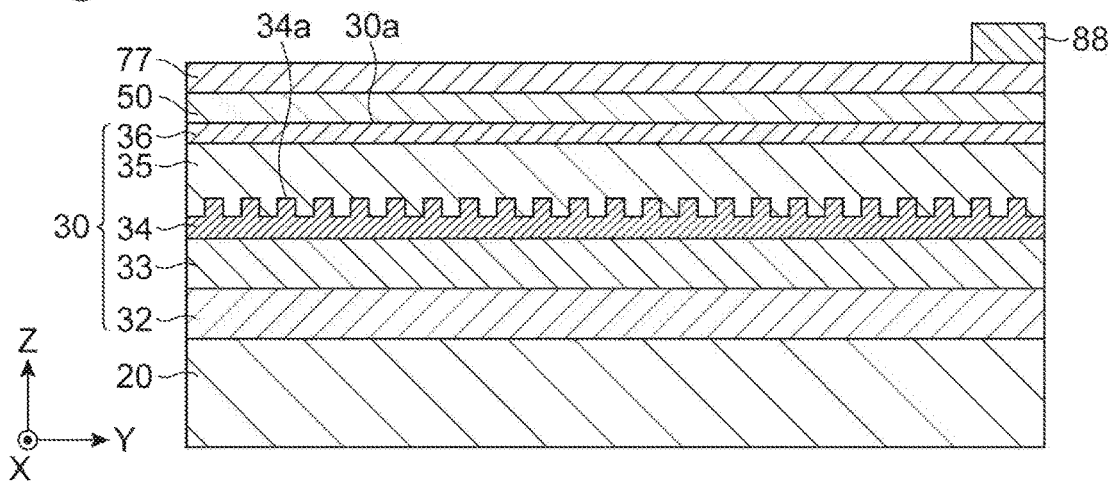
FIG. 21B is a schematic view showing a major process in the method for fabricating the quantum cascade semiconductor laser shown in FIG. 20.
Figure 21C:
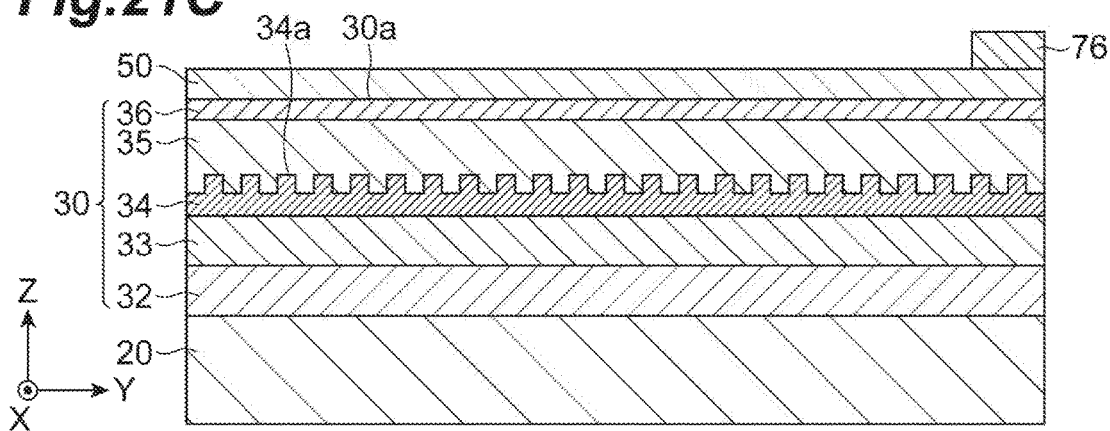
FIG. 21C is a schematic view showing a major process in the method for fabricating the quantum cascade semiconductor laser shown in FIG. 20.

A description will be given of a method for fabricating the quantum cascade laser 1G. This method has a former part, which has the same process steps as those in the above embodiment and ends at the third crystal growth step (shown in FIG. 5C), and a latter part. FIGS. 21A to 21C are schematic views each showing a process of fabricating the quantum cascade laser 1G shown in FIG. 20. FIGS. 21A to 21C are cross sections, each of which is taken along a plane parallel to the YZ plane, showing the semiconductor laminate 30 of the quantum cascade laser 1G. After the third crystal growth step, the mask 81 is removed, and the upper electrode 50 is formed on the upper surface 30a. As shown in FIG. 21A, an insulating film 77 is formed on the upper surface 30a. As shown in FIG. 21B, the insulating film 77 for the insulating film 76 is deposited on the upper electrode 50. Resist is applied to the upper electrode 50, and then is patterned to form a resist mask 88 with a pattern, which defines the shape of the insulating film 76. The insulating film 77 has a part covered with the resist mask 88 and is etched with the resist mask 88, so that the part of the insulating film 77 is left on the upper electrode 50. After the etching, the resist mask 88 is removed, as shown in FIG. 21A, to form the insulating film 76 on the electrode 50. The latter part is the same as that of the embodiment.

(Fifth Modification)

Figure 22:
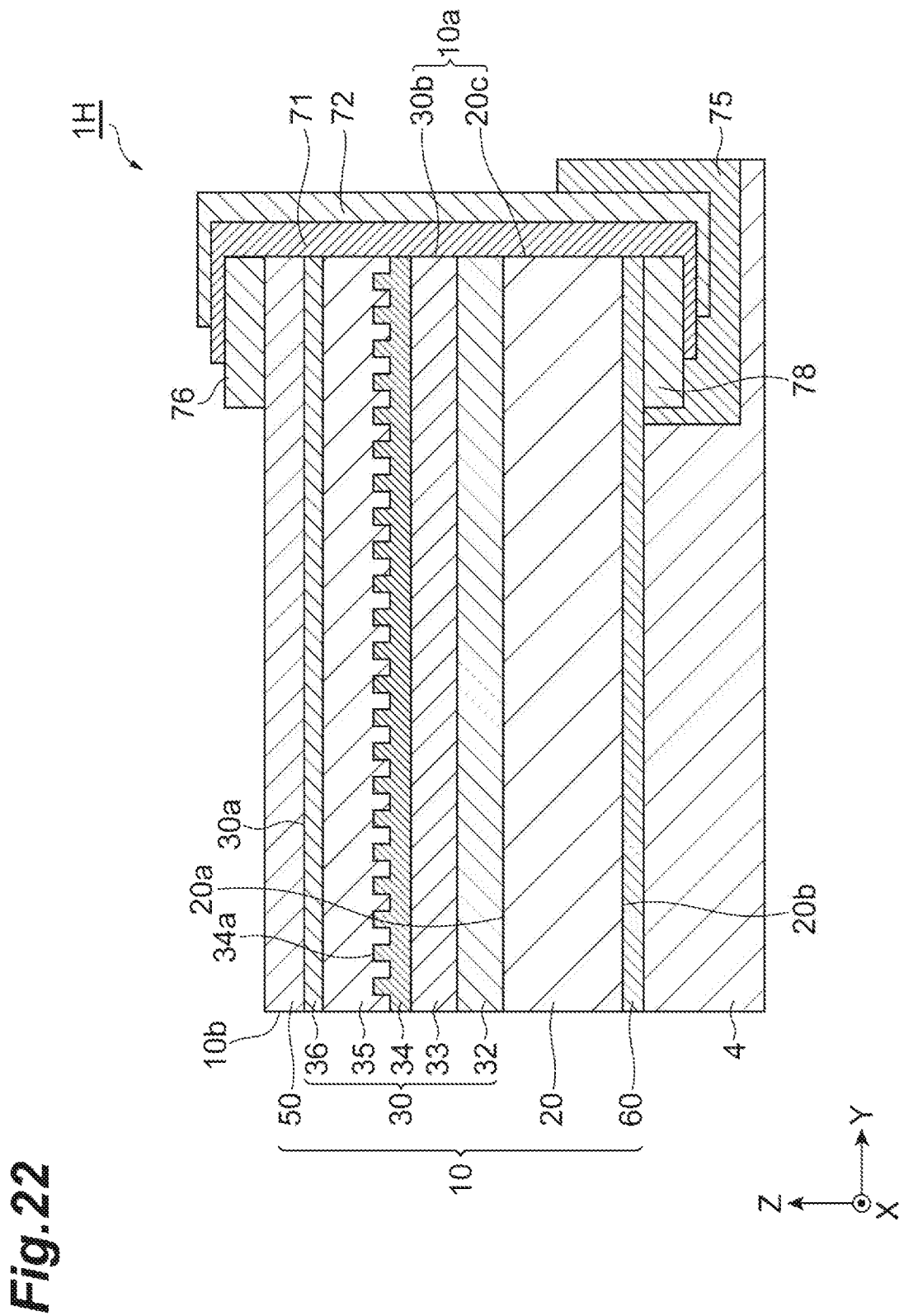
FIG. 22 is a perspective view showing a quantum cascade semiconductor laser according to a fifth modified embodiment.

FIG. 22 is a cross-sectional view showing a quantum cascade laser 1H according to the fifth modification of the above embodiment. In FIG. 22, the cross-section is taken along a plane parallel to the YZ plane and shows the semiconductor laminate 30 of the quantum cascade laser 1H. This modified example is different from the above embodiment in that the quantum cascade laser 1H further has an insulating film 78 (a fourth insulating film) on the upper electrode 50, and also includes an insulating film 76 according to the fourth modified example. The quantum cascade laser 1G is provided with the insulating film 78 between the upper electrode 50 and the insulating film 71 in the Z direction, and the insulating film 78 makes contact with both the lower electrode 60 and the insulating film 71. The insulating film 78 has one end, which is aligned with the end face 10b along a reference plane, and another end, which is apart from the end face 10b in the Y direction. The ends of the insulating film 71 and metal film 72 are located on the top of the insulating film 76. The insulating film 76 has a first portion and a second portion, which are arranged in the direction from the rear end face 10a to the front end face 10b. In the insulating film 78, the first portion is not covered with the insulating film 71 and the metal film 72, and the second portion is covered with the insulating film 71 and the metal film 72. The end of the insulating film 71 is distant from the rear end face 10a with respect to the end of the metal film 72.

The insulating film 78 has a thickness larger than that of the insulating film 71 on the lower electrode 60 in the Z direction, and for example, has a thickness of 100 nm or more, and if possible, a 150 nm or more. The insulating film 78 is made of dielectric material, which is the same as that of the insulating film 71, and may be made of dielectric material, which is different from that of the insulating film 71. The insulating film 78 is formed of dielectric material, including $SiO_2$, SiON, SiN, alumina, a BCB resin, or a polyimide resin. SiON and SiN each exhibiting an excellent adhesiveness is good for the insulating film 78.

Disposing the insulating film 78 along with the insulating film 71 between the lower electrode 60 and the metal film 72 can provide a thick insulating region (including the insulating films 71 and 78), allowing the quantum cascade laser 1H to have an excellent dielectric strength. The addition of the insulating film 78 allows the insulating films 71 and 78 to endure the external voltage (a high voltage of, for example, 10 volts) applied between the lower electrode 60 and the metal film 72, thereby preventing the insulating break-down of the insulating films 71 and 78 caused by the applied voltage. The quantum cascade laser 1H can avoid the deterioration of the device performances, which may be caused by the insulating break-down.

A description will be given of a method for fabricating the quantum cascade laser 1H. In the method, the insulating film 76 is formed on the upper electrode 50, and then the insulating film 78 is formed on the lower electrode 60 in the same matter as that of the insulating film 76. The subsequent processes are the same as those of the above embodiment.

The quantum cascade semiconductor laser of the present invention is not limited to the above-described quantum cascade semiconductor lasers, and other modifications are possible. For example, the above-described embodiment and each of the modifications may be combined with each other in accordance with purposes and effects according to the above-described embodiments. The insulating film and the metal film are disposed on the rear end face of the semiconductor device in the above-described embodiments and modifications, but the insulating film and the metal film may be disposed on the front end face or on both the front and rear end faces of the semiconductor device. The quantum cascade laser according to the above-described embodiments and modifications each have a buried-hetero structure, and if needed, has another structure, such as a high mesa structure with an insulating film (for example, a dielectric film, such as $SiO_2$) formed on both side faces of the semiconductor laminate 30. Further, the above-described embodiments and modifications each have a DFB quantum cascade laser with the diffraction grating layer 34, but the present invention is not limited thereto. The above-described embodiments and modifications can be similarly applied to, for example, a Fabry-Perot (FP) type quantum cascade laser without the diffraction grating layer 34. The FP-type quantum cascade laser has the same improvement as the DFB type quantum cascade laser. The quantum cascade laser according to the above-described embodiments and modifications includes the upper electrode working as the cathode electrode, and the lower electrode working as the anode electrode. If needed, the quantum cascade laser according to the above-described embodiments and modifications may include the upper electrode working as the anode electrode and the lower electrode working as the cathode electrode as well. This quantum cascade laser has the same effects as the above-described embodiments and modifications.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising:
a semiconductor substrate including a principal surface, a back surface, and a substrate end face, the principal surface and the back surface being arranged in a first direction, the principal surface being opposite to the back surface, the substrate end face extending along a reference plane intersecting a second direction, and the second direction intersecting the first direction;
a semiconductor laminate disposed on the principal surface of the substrate, the semiconductor laminate having an upper surface and a laminate end face, the semiconductor laminate including a core layer extending from the laminate end face in the second direction, and a cladding layer disposed on the core layer, and the laminate end face extending along the reference plane;
a first electrode disposed on the semiconductor laminate, the semiconductor laminate being disposed between the first electrode and the semiconductor substrate;
a second electrode disposed on the back surface of the substrate;
a first insulating film disposed on the laminate end face, the substrate end face, and the first electrode;
a metal film disposed on the first insulating film and the laminate end face, the substrate end face, and the first electrode; and
a second insulating film disposed on the second electrode and the substrate end face, the metal film being disposed between the first insulating film and the second insulating film.

2. The quantum cascade laser according to claim 1, wherein the second insulating film has an end on the substrate end face.

3. The quantum cascade laser according to claim 1, wherein the second insulating film is disposed on the first electrode.

4. The quantum cascade laser according to claim 1, wherein
the upper surface of the semiconductor laminate has a first area and a second area that are arranged in the second direction,
the second area of the semiconductor laminate is disposed between the laminate end face and the first area of the semiconductor laminate, and
the first electrode has a first thickness on the first area of the semiconductor laminate and a second thickness on the second area of the semiconductor laminate, and in the first electrode, the second thickness is smaller than the first thickness.

5. The quantum cascade laser according to claim 1, wherein
the upper surface of the semiconductor laminate has a first area and a second area that are arranged in the second direction,
the second area of the semiconductor laminate is disposed between the laminate end face and the first area of the semiconductor laminate, and
the first electrode has an end apart from the laminate end face and the second area of the semiconductor laminate.

6. The quantum cascade laser according to claim 1, wherein
the back surface of the semiconductor substrate has a first area and a second area that are arranged in the second direction,
in the semiconductor substrate, the second area is disposed between the first area and the substrate end face, and
the second electrode has a first thickness on the first area of the semiconductor substrate and a second thickness on the second area of the semiconductor substrate, and in the second electrode, the second thickness is smaller than the first thickness.

7. The quantum cascade laser according to claim 1, wherein
the back surface of the semiconductor substrate has a first area and a second area that are arranged to the second direction,
in the semiconductor substrate, the second area is disposed between the substrate end face and the first area, and
the second electrode has an end apart from the substrate end face and the second area of the semiconductor substrate.

8. The quantum cascade laser according to claim 5, wherein
the back surface of the semiconductor substrate has a first area and a second area that are arranged to the second direction,
in the semiconductor substrate, the second area is disposed between the substrate end face and the first area, and
the second electrode has an end apart from the substrate end face and the second area of the semiconductor substrate.

9. The quantum cascade laser according to claim 1, further comprising a third insulating film,
the first electrode, the first insulating film, and the third insulating film being arranged in the first direction.

10. The quantum cascade laser according to claim 9, wherein the third insulating film includes at least one of $SiO_2$, SiON, SiN, alumina, a BCB resin, or a polyimide resin.

11. The quantum cascade laser according to claim 9, further comprising a fourth insulating film,
the first insulating film and the metal film being disposed on the second electrode,
the second electrode, the fourth insulating film, and the first insulating film being arranged in the first direction.

12. The quantum cascade laser according to claim 11, wherein the fourth insulating film includes at least one of $SiO_2$, SiON, SiN, alumina, a BCB resin, or a polyimide resin.

13. The quantum cascade laser according to claim 1, wherein the metal film includes gold.

* * * * *